(12) United States Patent
Oike

(10) Patent No.: US 12,144,181 B2
(45) Date of Patent: Nov. 12, 2024

(54) SEMICONDUCTOR MEMORY

(71) Applicant: Kioxia Corporation, Tokyo (JP)

(72) Inventor: Go Oike, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/346,473

(22) Filed: Jul. 3, 2023

(65) Prior Publication Data
US 2024/0008280 A1    Jan. 4, 2024

Related U.S. Application Data

(63) Continuation of application No. 17/835,134, filed on Jun. 8, 2022, now Pat. No. 11,737,279, which is a
(Continued)

(30) Foreign Application Priority Data

May 31, 2018    (JP) .................................. 2018-105291

(51) Int. Cl.
| | |
|---|---|
| *H10B 43/20* | (2023.01) |
| *H01L 23/522* | (2006.01) |
| *H01L 23/528* | (2006.01) |
| *H01L 27/06* | (2006.01) |
| *H10B 41/20* | (2023.01) |

(Continued)

(52) U.S. Cl.
CPC .......... *H10B 43/40* (2023.02); *H01L 23/5226* (2013.01); *H01L 23/528* (2013.01); *H01L 27/0688* (2013.01); *H10B 41/20* (2023.02); *H10B 41/23* (2023.02); *H10B 41/27* (2023.02); *H10B 41/30* (2023.02); *H10B 41/70* (2023.02); *H10B 43/10* (2023.02); *H10B 43/20* (2023.02); *H10B 43/27* (2023.02); *H10B 43/35* (2023.02); *H10B 43/50* (2023.02); *H10B 53/20* (2023.02);
(Continued)

(58) Field of Classification Search
CPC ........ H10B 41/20; H10B 41/23; H10B 41/27; H10B 41/30; H10B 41/70; H10B 43/20; H10B 43/27; H10B 43/35; H10B 53/20; H10B 43/10; H10B 43/30; H10B 43/40; H10B 43/50
See application file for complete search history.

(56) References Cited

U.S. PATENT DOCUMENTS

| | | |
|---|---|---|
| 7,936,004 B2 | 5/2011 | Kito et al. |
| 9,806,091 B2 | 10/2017 | Miyagawa et al. |

(Continued)

FOREIGN PATENT DOCUMENTS

JP    2007-266143 A    10/2007

*Primary Examiner* — Eduardo A Rodela
(74) *Attorney, Agent, or Firm* — Kim & Stewart LLP

(57) ABSTRACT

A semiconductor memory includes first to fourth stacked bodies. The first stacked body includes a first conductor, and an alternating stack of first insulators and second conductors above the first conductor in a region. The second stacked body includes a third conductor, and an alternating stack of second insulators and fourth conductors above the third conductor in another region. The third stacked body includes a fifth conductor adjacent to the first conductor via a third insulator in a separation region. The fourth stacked body includes a seventh conductor adjacent to the third conductor via a fifth insulator in the separation region. The fifth conductor is electrically insulated from the seventh conductor.

13 Claims, 21 Drawing Sheets

Related U.S. Application Data continuation of application No. 16/910,360, filed on Jun. 24, 2020, now Pat. No. 11,387,247, which is a continuation of application No. 16/287,233, filed on Feb. 27, 2019, now Pat. No. 10,741,573.

(51) Int. Cl.

| | |
|---|---|
| *H10B 41/23* | (2023.01) |
| *H10B 41/27* | (2023.01) |
| *H10B 41/30* | (2023.01) |
| *H10B 41/70* | (2023.01) |
| *H10B 43/10* | (2023.01) |
| *H10B 43/27* | (2023.01) |
| *H10B 43/35* | (2023.01) |
| *H10B 43/40* | (2023.01) |
| *H10B 43/50* | (2023.01) |
| *H10B 53/20* | (2023.01) |
| *H01L 23/532* | (2006.01) |

(52) U.S. Cl.
CPC .. *H01L 23/53228* (2013.01); *H01L 23/53257* (2013.01); *H01L 23/53271* (2013.01)

(56) References Cited

U.S. PATENT DOCUMENTS

| | | | |
|---|---|---|---|
| 10,930,663 B2* | 2/2021 | Lu | H01L 24/05 |
| 2014/0043902 A1 | 2/2014 | Unno | |
| 2015/0221667 A1 | 8/2015 | Fukuzumi et al. | |
| 2015/0325303 A1 | 11/2015 | Hashimoto et al. | |
| 2017/0040254 A1 | 2/2017 | Hwang et al. | |
| 2018/0294225 A1* | 10/2018 | Lee | H10B 43/40 |
| 2018/0374862 A1* | 12/2018 | Lee | H10B 43/50 |
| 2019/0214403 A1 | 7/2019 | Oike et al. | |
| 2021/0091063 A1* | 3/2021 | Ninomiya | H01L 24/03 |

* cited by examiner

SEMICONDUCTOR MEMORY

CROSS-REFERENCE TO RELATED APPLICATIONS

This application is a continuation of U.S. patent application Ser. No. 17/835,134, filed on Jun. 8, 2022, which is a continuation of U.S. patent application Ser. No. 16/910,360, filed on Jun. 24, 2020, now U.S. Pat. No. 11,387,247, issued on Jul. 12, 2022, which is a continuation of U.S. patent application Ser. No. 16/287,233, filed on Feb. 27, 2019, now U.S. Pat. No. 10,741,573, issued on Aug. 11, 2020, which is based upon and claims the benefit of priority from Japanese Patent Application No. 2018-105291, filed on May 31, 2018, the entire contents of each of which are incorporated herein by reference.

FIELD

Embodiments described herein relate generally to a semiconductor memory.

BACKGROUND

A NAND flash memory capable of storing data in a nonvolatile manner is known.

DETAILED DESCRIPTION

Figure 1:
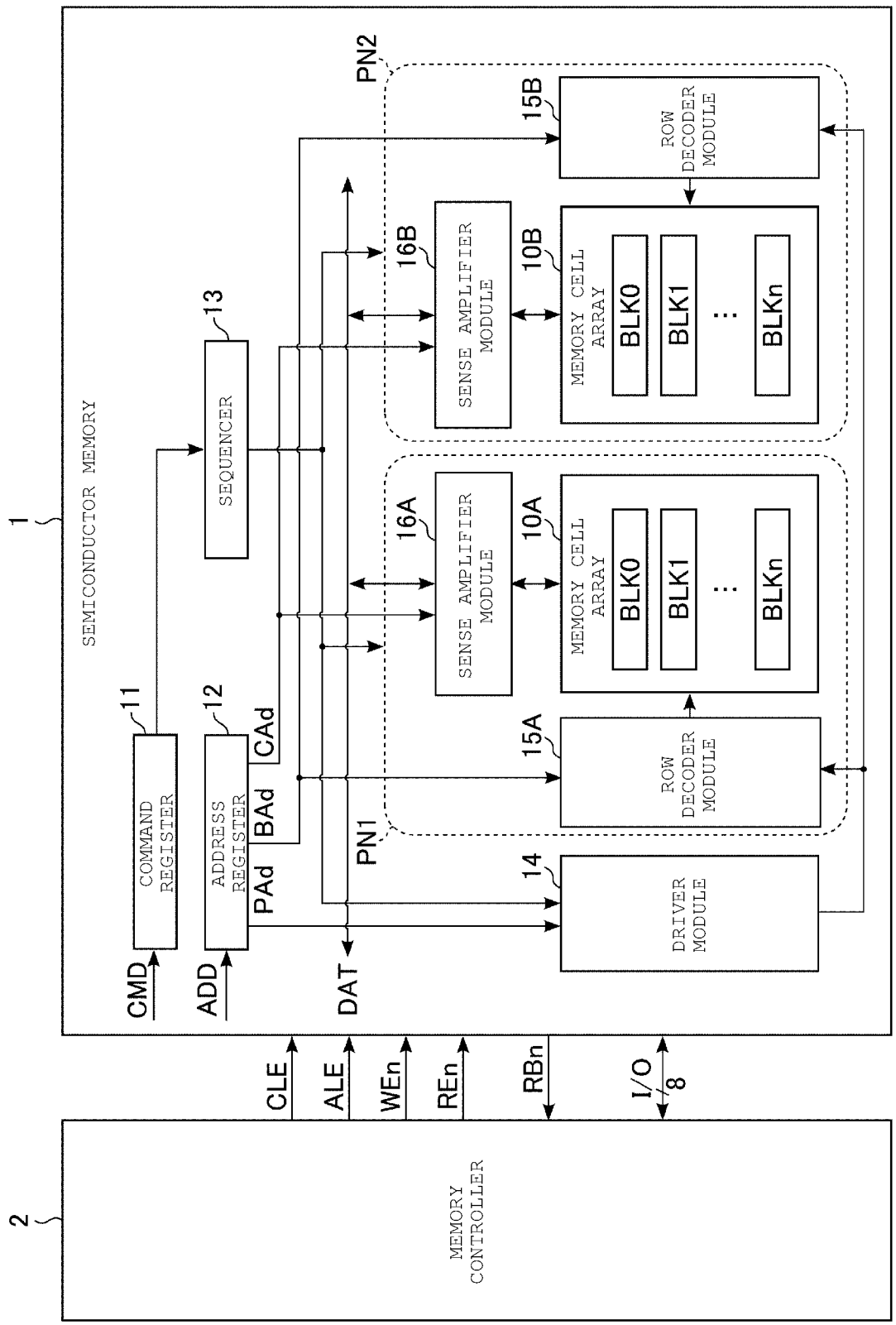
FIG. 1 is a block diagram illustrating a semiconductor memory according to an embodiment.

Embodiments provide a semiconductor memory capable of improving reliability of data stored in a memory cell.

In general, according to an embodiment, a semiconductor memory includes a substrate, and first to fourth stacked bodies. First to seventh regions are provided in this order along a direction parallel to a surface of the substrate. The first stacked body includes a first conductor and an alternating stack of first insulators and second conductors above the first conductor, in the first to third regions. The second stacked body includes a third conductor and an alternating stack of second insulators and fourth conductors above the third conductor, in the fifth to seventh regions. A columnar first contact is provided on one of the second conductors closest to the first conductor in the first region. A columnar second contact is provided on one of the fourth conductors closest to the third conductor in the seventh region. A plurality of first pillars is provided, and each of the first pillars extends through the first stacked body in the second region, and has memory cell regions at intersections with the second conductors. A plurality of second pillars is provided, and each of the second pillars extends through the second stacked body in the sixth region, and has memory cell regions at intersections with the fourth conductors. The third stacked body includes a fifth conductor at a same layer level as the first conductor and adjacent to the first conductor via a third insulator and an alternating stack of fourth insulators and sixth conductors above the fifth conductor, in the fourth region. The fourth stacked body includes a seventh conductor at a same layer level as the second conductor and adjacent to the third conductor via a fifth insulator and an alternating stack of sixth insulators and eighth conductors above the seventh conductor, in the fourth region. The fifth conductor is electrically insulated from the seventh conductor.

In the following, embodiments will be described with reference to the drawings. Each embodiment exemplifies a device or a method for embodying the technical concept of the present disclosure. The drawings are schematic or conceptual, and a dimension and a proportion in each drawing cannot be said to be the same as actual ones. The technical concept of the present disclosure is not specified by a shape, a structure, a disposition, and the like of an element.

In the following description, elements having the substantially same function and configuration are given the same reference numeral. Numbers after a letter forming a reference sign are referred to by a reference sign including the same letter, and are used to differentiate elements having the same configuration. Similarly, letters after a number forming a reference sign are referred to by a reference sign including the same number, and are used to differentiate elements having the same configuration. In a case where elements indicated by reference signs including the same letter or number are not required to be differentiated from each other, such elements are referred to by a reference sign including only the letter or the number.

1. Embodiment

In the following, a semiconductor memory 1 according to an embodiment will be described.

1-1. Configuration of Semiconductor Memory 1

1-1-1. Overall Configuration of Semiconductor Memory 1

The semiconductor memory 1 is, for example, a NAND flash memory capable of storing data in a nonvolatile manner. The semiconductor memory 1 is controlled by, for example, an external memory controller 2. FIG. 1 illustrates a configuration example of the semiconductor memory 1 according to the embodiment.

As illustrated in FIG. 1, the semiconductor memory 1 includes, for example, memory cell arrays 10A and 10B, a command register 11, an address register 12, a sequencer 13, a driver module 14, row decoder modules 15A and 15B, and sense amplifier modules 16A and 16B.

In the following, a set of the memory cell array 10A, the row decoder module 15A, and the sense amplifier module 16A will be referred to as a plane PN1. A set of the memory cell array 10B, the row decoder module 15B, and the sense amplifier module 16B will be referred to as a plane PN2.

Each of the memory cell arrays 10A and 10B stores data in a nonvolatile manner. A plurality of bit lines and a plurality of word lines are provided in each of the memory cell arrays 10A and 10B. Each of the memory cell arrays 10A and 10B includes a plurality of blocks BLK0 to BLKn (where n is an integer of 1 or greater). The block BLK is an aggregate of nonvolatile memory cells, and is used as, for example, a data erase unit. Each memory cell is associated with a single bit line and a single word line. A detailed configuration of the memory cell array 10 will be described later.

The command register 11 stores a command CMD which is received from the memory controller 2 by the semiconductor memory 1. The command CMD includes, for example, commands for causing the sequencer 13 to perform a read operation, a write operation, an erase operation, and the like.

The address register 12 stores address information ADD which is received from the memory controller 2 by the semiconductor memory 1. The address information ADD includes, for example, a block address BAd, a page address PAd, and a column address CAd. For example, the block address BAd, the page address PAd, and the column address CAd are respectively used to select the block BLK, a word line, and a bit line.

The sequencer 13 controls the overall operation of the semiconductor memory 1. The sequencer 13 can separately control the plane PN1 and the plane PN2. For example, the sequencer 13 controls the driver module 14 and the plane PN1 based on the command CMD stored in the command register 11, so as to perform a read operation, a write operation, an erase operation, and the like on the plane PN1. Similarly, the sequencer 13 may perform a read operation, a write operation, an erase operation, and the like on the plane PN2.

The driver module 14 generates voltages used for a read operation, a write operation, an erase operation, and the like. The driver module 14 applies a generated voltage to, for example, a signal line corresponding to a selected word line based on the page address PAd stored in the address register 12.

The row decoder modules 15A and 15B are provided corresponding to the memory cell arrays 10A and 10B respectively. The row decoder module 15 selects one block BLK in the corresponding memory cell array 10 based on the block address BAd stored in the address register 12. The row decoder module 15 transmits the voltage applied to the signal line corresponding to the selected word line, to the selected word line in the selected block BLK.

The sense amplifier modules 16A and 16B are provided corresponding to the memory cell arrays 10A and 10B respectively. In a write operation, the sense amplifier module 16 applies a desired voltage to a bit line provided in the corresponding memory cell array 10 according to write data DAT received from the memory controller 2. In a read operation, the sense amplifier module 16 determines data stored in a memory cell based on a voltage of a bit line, reads a determination result, and transmits the determination result to the memory controller 2 as the data DAT.

Communication between the semiconductor memory 1 and the memory controller 2 is performed based on, for example, a NAND interface standard. For example, a command latch enable signal CLE, an address latch enable signal ALE, a write enable signal WEn, a read enable signal REn, a ready/busy signal RBn, and an input/output signal I/O are used in communication between the semiconductor memory 1 and the memory controller 2.

The command latch enable signal CLE is a signal indicating that the input/output signal I/O received by the semiconductor memory 1 is the command CMD. The address latch enable signal ALE is a signal indicating that the input/output signal I/O received by the semiconductor memory 1 is the address information ADD. The write enable signal WEn is a signal for instructing the semiconductor memory 1 to input the input/output signal I/O. The read enable signal REn is a signal for instructing the semiconductor memory 1 to output the input/output signal I/O.

The ready/busy signal RBn is a signal for notifying the memory controller 2 whether the semiconductor memory 1 is in a ready state of receiving a command from the memory controller 2 or in a busy state of not receiving a command. The input/output signal I/O is, for example, a signal with an 8-bit width, and may include the command CMD, the address information ADD, the data DAT, and the like.

A single semiconductor device may be configured through a combination of the semiconductor memory 1 and the memory controller 2. Such a semiconductor device may include, for example, a memory card such as an SD™ card, or a solid state drive (SSD).

The embodiment shows the semiconductor memory 1 having two planes (planes PN1 and PN2). Alternatively, the semiconductor memory 1 may include three or more planes. A configuration of a plane is not limited to the above-described configuration, and a plane may include at least the memory cell array 10.

1-1-2. Circuit Configuration of Semiconductor Memory 1

Figure 2:
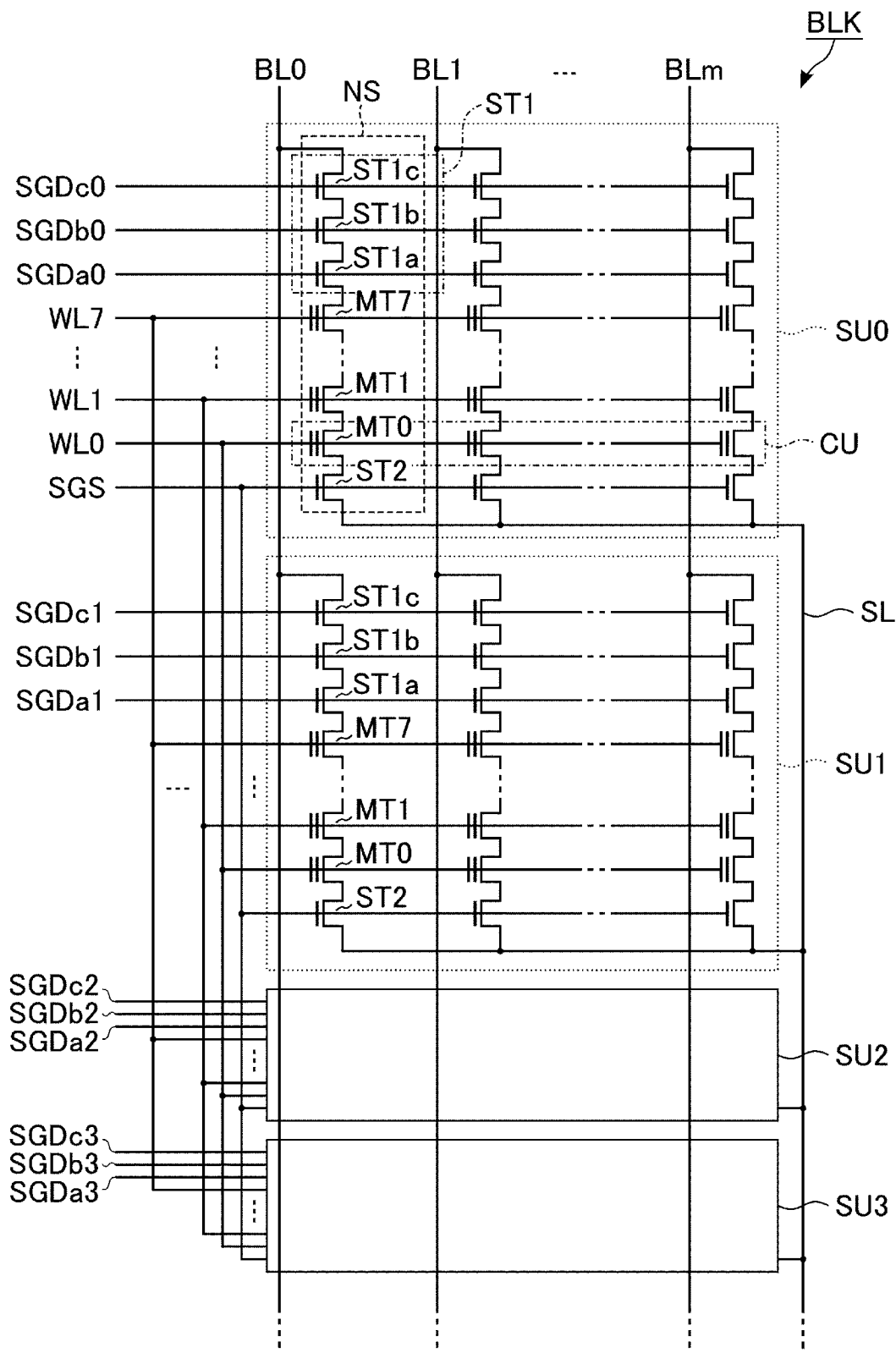
FIG. 2 is a circuit diagram illustrating an example of a circuit configuration of a memory cell array of the semiconductor memory according to the embodiment.

FIG. 2 illustrates an example of a circuit configuration of the memory cell array 10 of the semiconductor memory 1 according to the embodiment by extracting one block BLK from a plurality of blocks BLK in the memory cell array 10.

As illustrated in FIG. 2, the block BLK includes, for example, four string units SU0 to SU3. Each string unit SU includes a plurality of NAND strings NS respectively associated with bit lines BL0 to BLm (where m is an integer of 1 or greater).

The NAND string NS includes, for example, memory cell transistors MT0 to MT7, and select transistors ST1 and ST2. The select transistor ST1 is, for example, a set of select transistors ST1a, ST1b, and ST1c which are connected in series to each other. The select transistor ST1 may be designed to have any number of transistors.

The memory cell transistor MT includes a control gate and a charge storage layer, and stores data in a nonvolatile manner. Each of the select transistors ST1 and ST2 is used to select the string unit SU during various operations.

In each NAND string NS, the memory cell transistors MT0 to MT7 are connected in series to each other between a source of the select transistor ST1a and a drain of the select transistor ST2. The control gates of the memory cell transistors MT0 to MT7 in the identical block BLK are respectively connected in common to the word lines WL0 to WL7.

In each NAND string NS, a drain of the select transistor ST1c is connected to the corresponding bit line BL. In other words, one end of the select transistor ST1 is connected to one end of the memory cell transistors MT0 to MT7 connected in series to each other, and the other end of the select transistor ST1 is connected to the corresponding bit line BL.

Gates of the select transistors ST1a, ST1b, and ST1c in the string unit SU0 are respectively connected in common to select gate lines SGDa0, SGDb0, and SGDc0. Gates of the select transistors ST1a, ST1b, and ST1c in the string unit SU1 are respectively connected in common to select gate lines SGDa1, SGDb1, and SGDc1.

Gates of the select transistors ST1a, ST1b, and ST1c in the string unit SU2 are respectively connected in common to select gate lines SGDa2, SGDb2, and SGDc2. Gates of the select transistors ST1a, ST1b, and ST1c in the string unit SU3 are respectively connected in common to select gate lines SGDa3, SGDb3, and SGDc3.

Sources of the select transistor ST2 in the identical block BLK are connected in common to a source line SL. Gates of the select transistors ST2 in the identical block BLK are connected in common to a select gate line SGS.

In the circuit configuration of the memory cell array 10 described above, drains of the select transistors ST1c corresponding to an identical column among a plurality of blocks BLK are connected to the identical bit line BL. The source line SL is connected in common to, for example, the plurality of blocks BLK.

A plurality of memory cell transistors MT connected to a common word line WL in a single string unit SU will be referred to as, for example, a cell unit CU. A storage capacity of each cell unit CU changes based on the number of bits of data stored in the memory cell transistor MT.

For example, a single cell unit CU may store 1-page data in a case where each memory cell transistor MT stores 1-bit data, and may store 2-page data in a case where each memory cell transistor MT stores 2-bit data.

As described above, "1-page data" is defined by a total amount of data stored in the cell unit CU configured with the memory cell transistors MT each storing 1-bit data.

A circuit configuration of the memory cell array 10 of the semiconductor memory 1 according to the embodiment is not limited to the above-described configuration. For example, each NAND string NS may be designed to have any number of memory cell transistors MT and select transistors ST1 and ST2. Each block BLK may be designed to have any number of string units SU.

1-1-3. Structure of Semiconductor Memory 1

In the following, a description will be made of an example of a structure of the semiconductor memory 1 according to the embodiment. The semiconductor memory 1 according to the embodiment has a structure in which circuits such as the sense amplifier module 16 are provided between a semiconductor substrate and the memory cell array 10, that is, under the memory cell array 10.

In the drawings referred to below, an X direction corresponds to an extension direction of the word line WL, a Y direction corresponds to an extension direction of the bit line BL, and a Z direction corresponds to a vertical direction to a front surface of a semiconductor substrate 20 on which the semiconductor memory 1 is formed.

In cross-sectional views referred to below, for better understanding of the drawings, elements such as an insulating layer (interlayer insulating film), a wiring, and a contact are not illustrated as appropriate. In plan views, for better understanding of the views, hatching is added as appropriate. Hatching added to the plan views is not necessarily associated with a material or a characteristic of a hatched element.

Planar Layout of Memory Cell Arrays 10A and 10B

Figure 3:
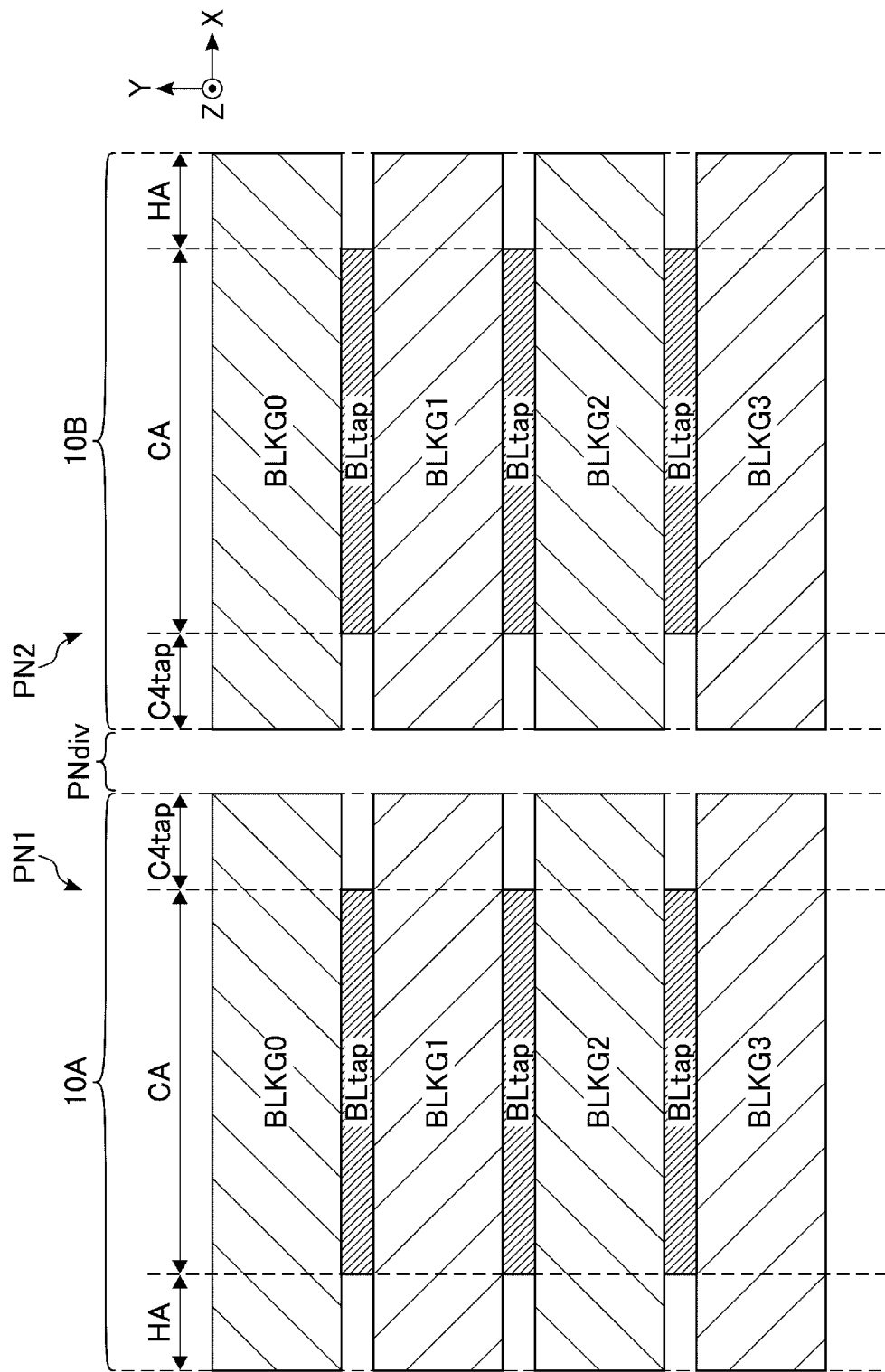
FIG. 3 illustrates a plan view of an example of the memory cell array of the semiconductor memory according to the embodiment.

FIG. 3 illustrates an example of a planar layout of the memory cell arrays 10A and 10B of the semiconductor memory 1 according to the embodiment.

As illustrated in FIG. 3, a region of the memory cell array 10A corresponding to the plane PN1 and a region of the memory cell array 10B corresponding to the plane PN2 are adjacent to each other in the X direction. A plane separation region PNdiv is provided between the region of the memory cell array 10A and the region of the memory cell array 10B.

Each of the regions corresponding to the memory cell arrays 10A and 10B may be divided into, for example, a cell region CA, a lead region HA, and a C4 connection region C4tap along the X direction. Specifically, the cell region CA (e.g., a first region), the lead region HA (e.g., a second region), and the C4 connection region C4tap (e.g., a third region) of the memory cell array 10A, the plane separation region PNdiv, and the C4 connection region C4tap (e.g., a fourth region), the lead region HA (e.g., a fifth region), and the cell region CA (e.g., a sixth region) of the memory cell array 10B are arranged in order in the X direction. In an embodiment, the lead region HA and the cell region CA of the memory cell array 10A may be referred to as first and second regions, respectively, and the cell region CA and the lead region HA of the memory cell array 10B may be referred to as third and fourth regions, respectively.

The cell region CA is a region in which a plurality of NAND strings NS are formed. The lead region HA is a region in which contacts for electrically connecting select gate lines SGD and SGS and the word lines WL connected to the NAND strings NS to the row decoder module 15 are formed. The C4 connection region C4tap is a region in which contacts for electrically connecting, for example, the source line SL connected to the NAND string NS or a power line or a signal line provided on the memory cell array 10 to circuits provided under the memory cell array 10 are formed.

Each of the C4 connection region C4tap of the memory cell array 10A and the C4 connection region C4tap of the memory cell array 10B is in contact with the plane separation region PNdiv. Each of the lead region HA of the memory cell array 10A and the lead region HA of the memory cell array 10B is separated from the plane separation region PNdiv. In each of the memory cell arrays 10A and 10B, the cell region CA is disposed between the lead region HA and the C4 connection region C4tap.

Each of the memory cell arrays 10A and 10B includes, for example, block groups BLKG0 to BLKG3. Each block group BLKG extends in the X direction, and the block groups BLKG0 to BLKG3 are arranged in the Y direction. Each memory cell array 10 may be designed to have any number of block groups BLKG. The block group BLKG includes a plurality of blocks BLK. For example, a BL connection region BLtap is provided between the block groups BLKG adjacent to each other in the cell region CA.

The BL connection region BLtap is a region in which a contact for electrically connecting the bit line BL connected to the NAND string NS to the sense amplifier module 16 disposed under the memory cell array 10 is formed.

Figure 4:
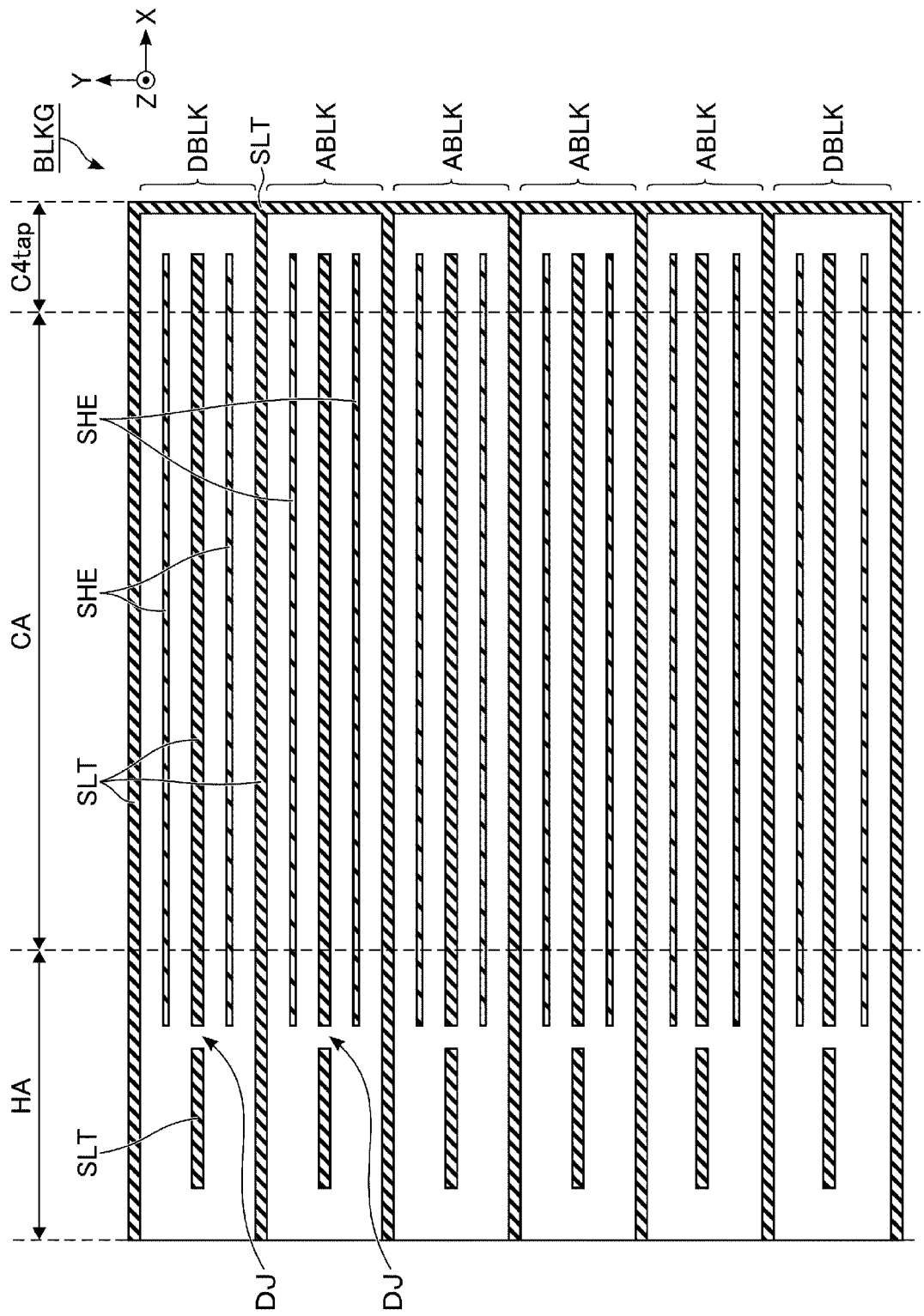
FIG. 4 illustrates a plan view of an example of the memory cell array of the semiconductor memory according to the first embodiment.

FIG. 4 illustrates an example of a more detailed planar layout of the memory cell array 10 of the semiconductor memory 1 according to the embodiment by extracting a single block group BLKG provided in the memory cell array 10A.

As illustrated in FIG. 4, the block group BLKG includes, for example, four active blocks ABLK and two dummy blocks DBLK.

The active block ABLK is the block BLK used to store data. The total number of active blocks ABLK in each memory cell array 10 corresponds to the total number of blocks BLK in each memory cell array 10.

The dummy block DBLK is the block BLK not used to store data. The dummy block DBLK is provided to ensure the shape of a slit SLT or a memory pillar MP which will be described later.

Each of the active block ABLK and the dummy block DBLK extends in the X direction. The four active blocks ABLK are arranged in the Y direction, and are disposed between the two dummy blocks DBLK.

Each of the active block ABLK and the dummy block DBLK is provided in, for example, a region of which two sides are in contact with a slit SLT (in the following, referred to as a horizontal-direction slit SLT) extending in the X direction and one side is in contact with a slit SLT (in the following, referred to as a vertical-direction slit SLT) extending in the Y direction.

Specifically, the vertical-direction slit SLT is provided at one end part of the block group BLKG in the X direction. A plurality of horizontal-direction slits SLT arranged in the Y direction are in contact with the vertical-direction slit SLT provided at the one end part.

In other words, the slit SLT is provided in a comb shape of which the other end part is open in the X direction. The dummy block DBLK or the active block ABLK is provided in a region between the horizontal-direction slits SLT adjacent to each other among a plurality of slits SLT provided in the comb-shaped slit SLT and arranged in the Y direction.

The vertical-direction slit SLT may be provided at the other end part of the block group BLKG in the X direction. In this case, a plurality of horizontal-direction slits SLT arranged in the Y direction may be in contact with or separated from the vertical-direction slit SLT at the other end part.

In the active block ABLK, for example, the horizontal-direction slit SLT which extends from the lead region HA to the C4 connection region C4tap in the X direction is provided in the region between the horizontal-direction slits SLT adjacent to each other. The horizontal-direction slit SLT has a slit separation part DJ in the lead region HA. For example, a slit SHE extending in the X direction is disposed between the horizontal-direction slits SLT arranged in the Y direction. In the active block ABLK, the slit SHE extends, for example, from the vicinity of the slit separation part DJ of the lead region HA to the C4 connection region C4tap.

In the dummy block DBLK, a region between the horizontal-direction slits SLT adjacent to each other includes the horizontal-direction slit SLT extending from the lead region HA to the C4 connection region C4tap in the X direction, for example, in the same manner as in the active block ABLK. A slit SHE extending in the X direction is disposed between the horizontal-direction slits arranged in the Y direction, for example, in the same manner as in the active block ABLK.

In the present specification, the peripheral region of the block group BLKG corresponds to a region adjacent to the dummy block DBLK via the horizontal-direction slit SLT provided outside the block group BLKG. In the slit separation part SLTdiv, a conductor in the dummy block DBLK is electrically connected to a conductor in the peripheral region of the block group BLKG.

Each block group BLKG may be designed to have any number of active blocks ABLK and dummy blocks DBLK, respectively. The dummy block DBLK may be disposed between the active blocks ABLK arranged in the Y direction. The number of horizontal-direction slits SLT in the respective regions of the active block ABLK and the dummy block DBLK may differ between the active block ABLK and the dummy block DBLK.

Structure of Memory Cell Array 10 in Cell Region CA

Figure 5:
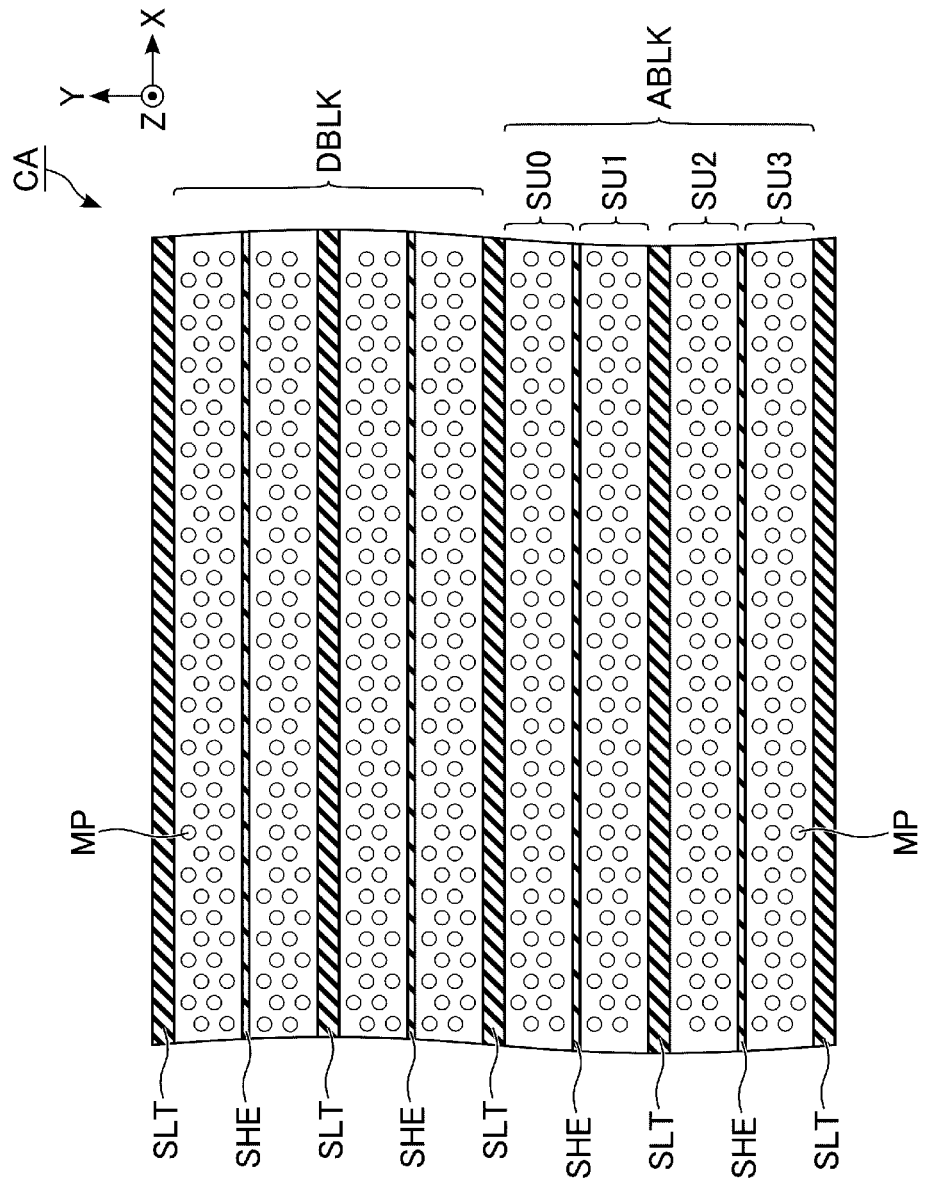
FIG. 5 illustrates a plan view of an example of a cell region of the memory cell array of the semiconductor memory according to the embodiment.

FIG. 5 illustrates an example of a planar layout of the cell region CA of the memory cell array 10 of the semiconductor memory 1 according to the embodiment by extracting one active block ABLK and one dummy block DBLK.

As illustrated in FIG. 5, in the cell region CA, the memory cell array 10 includes a plurality of memory pillars MP and a plurality of dummy memory pillars DMP. Specifically, in the active block ABLK, a plurality of memory pillars MP are arranged in a zigzag form between the slits SLT and SHE. For example, the dummy memory pillars DMP are disposed to overlap the slit SHE.

The memory pillar MP functions as, for example, a single NAND string NS. The dummy memory pillar DMP is a structural body which has the same structure as, for example, that of the memory pillar MP but is not used to store data.

For example, in the active block ABLK, an aggregate of a plurality of memory pillars MP provided between the slits SLT and SHE adjacent to each other corresponds to a single string unit SU. In other words, in the active block ABLK, the string unit SU extends in the X direction. For example, the string units SU0 to SU3 are arranged in the Y direction.

The rest of the planar layout of the dummy block DBLK in the cell region CA is the same as, for example, the planar layout of the active block ABLK, and thus a description thereof will be omitted.

Figure 6:
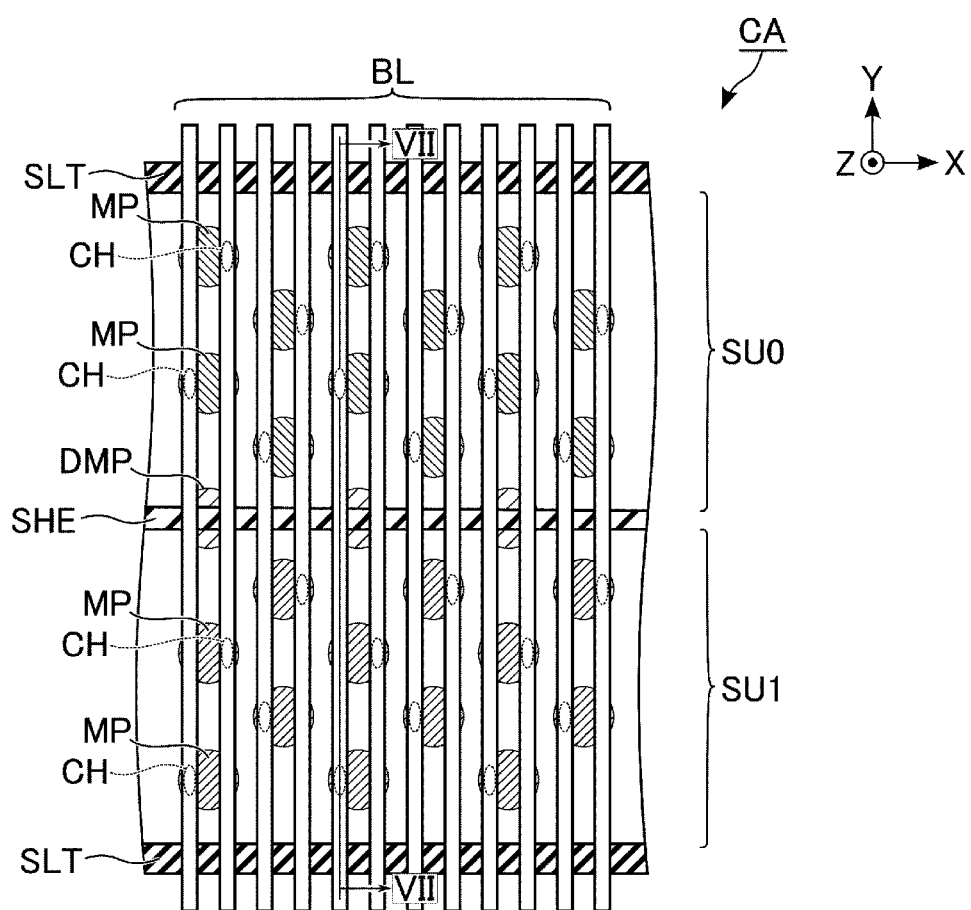
FIG. 6 illustrates a plan view of an example of the cell region of the memory cell array of the semiconductor memory according to the embodiment.

FIG. 6 illustrates an example of a more detailed planar layout of the cell region CA of the memory cell array 10 of the semiconductor memory 1 according to the embodiment by extracting the string units SU0 and SU1 of the active block ABLK.

As illustrated in FIG. 6, a plurality of bit lines BL and a plurality of contacts CH are disposed in the memory cell array 10 in correspondence to the memory pillars MP described with reference to FIG. 5.

Specifically, each of the plurality of bit lines BL extends in the Y direction, and the plurality of bit lines BL are arranged in the X direction. The plurality of contacts CH are provided between each bit line BL and the memory pillars MP corresponding to the bit line BL.

For example, each memory pillar MP overlaps two bit lines BL. Each memory pillar MP is electrically connected to a single bit line BL among a plurality of overlapping bit lines BL, via the columnar contact CH.

The number of bit lines BL overlapping the memory pillar MP may be designed to be any number. Each memory pillar MP may be electrically connected to a single bit line BL among a plurality of overlapping bit lines BL, via the columnar contact CH.

Figure 7:
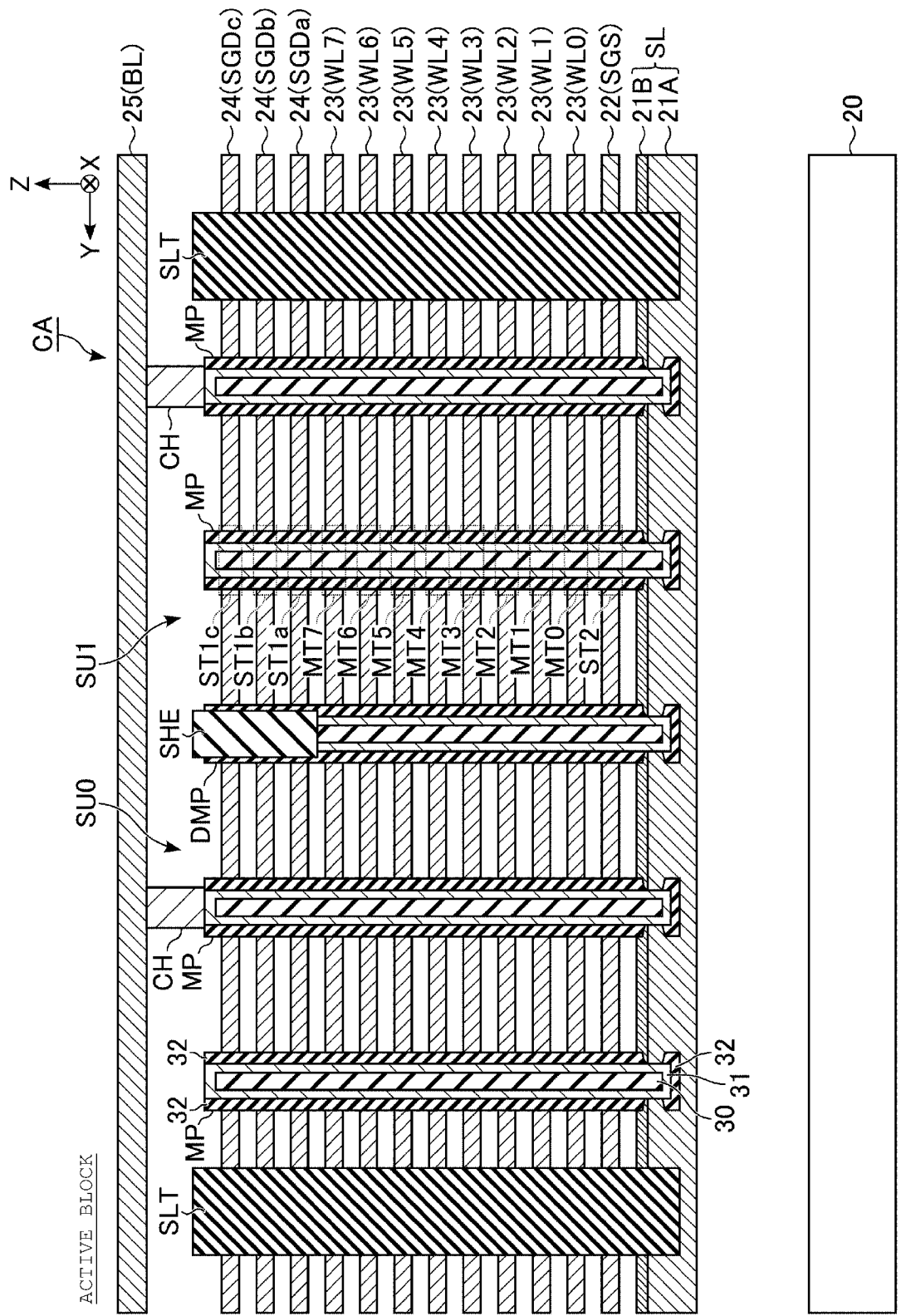
FIG. 7 illustrates a cross-sectional view of an example of the cell region of the memory cell array of the semiconductor memory according to the embodiment.

FIG. 7 illustrates a cross-sectional view of the memory cell array 10 taken along the line VII-VII in FIG. 6, and illustrates an example of a cross-sectional structure of the memory cell array 10 in a region corresponding to the active block ABLK in the cell region CA.

As illustrated in FIG. 7, the region corresponding to the active block ABLK in the cell region CA includes, for example, conductors 21A and 21B, and 22 to 25, the memory pillars MP, the dummy memory pillars DMP, the contacts CH, and the slits SLT and SHE.

The conductor 21A is provided on the semiconductor substrate 20 via an insulating layer. The conductor 21B is provided on the conductor 21A, and the conductors 21A and 21B are electrically connected to each other. The conductors 21A and 21B are formed, for example, in a plate shape which spreads along an XY plane, and are used as the source line SL. Each of the conductors 21A and 21B is, for example, poly-silicon (Si) doped with phosphor. The conductors 21A and 21B may be integrally formed.

For example, circuits (not illustrated) such as the row decoder module 15 or the sense amplifier module 16 are provided in a region between the semiconductor substrate 20 and the conductor 21A, that is, under the memory cell array 10.

Figure 11:
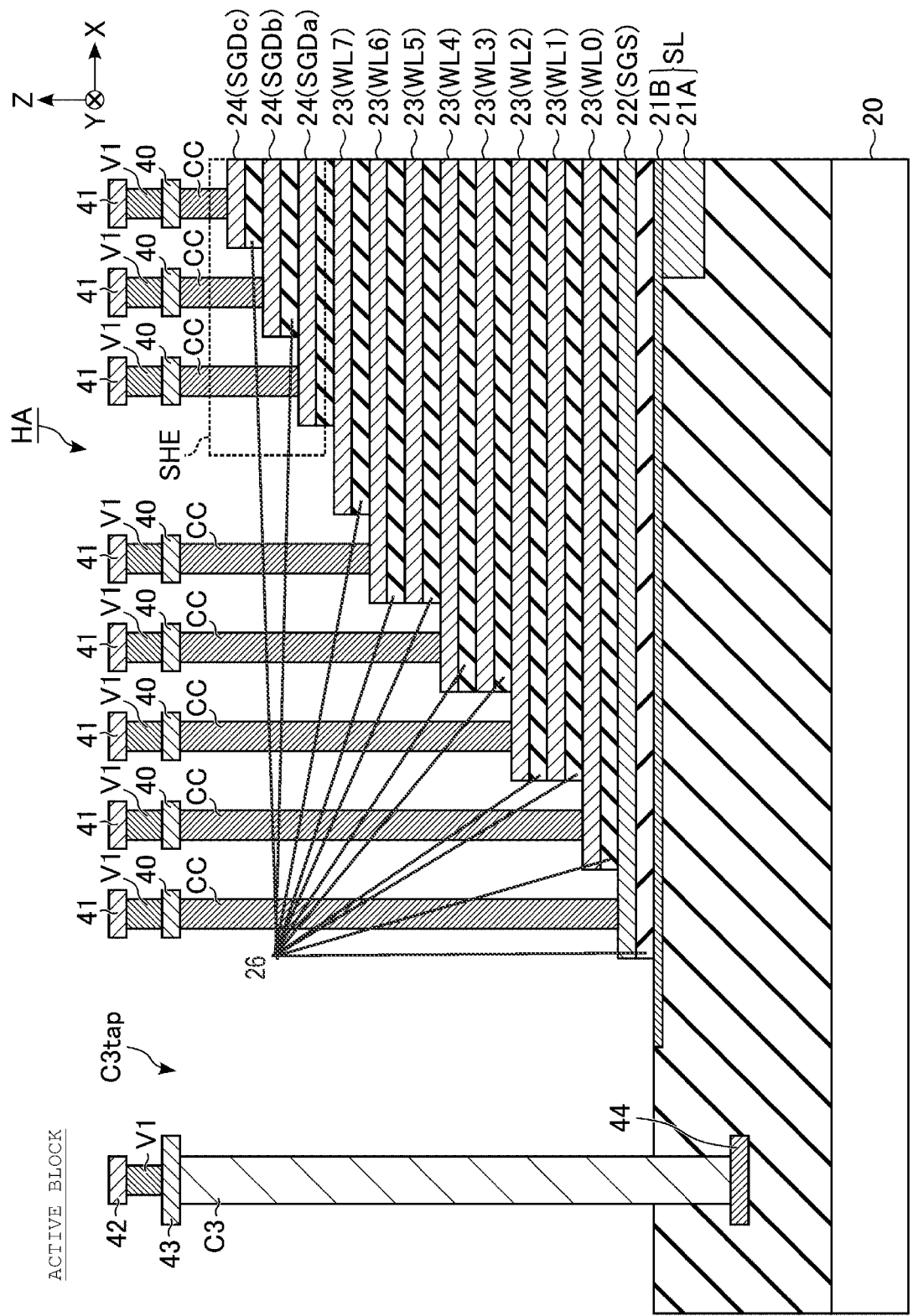
FIG. 11 illustrates a cross-sectional view of an example of the lead region of the memory cell array of the semiconductor memory according to the embodiment.
Figure 14:
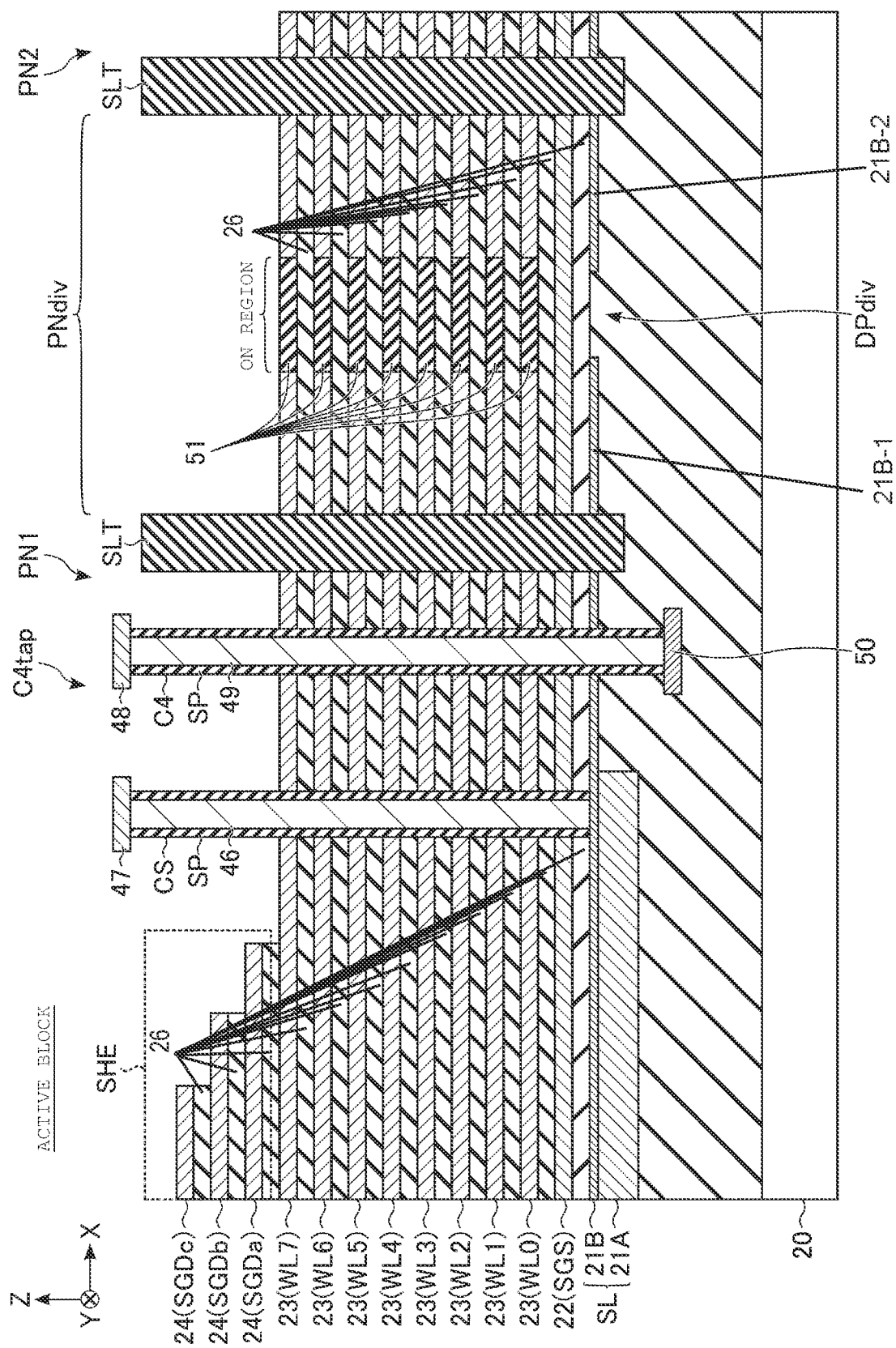
FIG. 14 illustrates a plan view of an example of the vicinity of the plane separation region of the semiconductor memory according to the embodiment.

The conductor 22 is provided on the conductor 21B via an insulating layer (e.g., an insulating layer 26 in FIGS. 11 and 14). The conductor 22 is formed, for example, in a plate shape which spreads along the XY plane, and is used as the select gate line SGS. The conductor 22 is, for example, poly-silicon (Si) doped with phosphor.

An insulating layer (e.g., an insulating layer 26 in FIGS. 11 and 14) and the conductor 23 are alternately stacked on the conductor 22. The conductor 23 is formed, for example, in a plate shape which spreads along the XY plane. The plurality of stacked conductors 23 are respectively used as the word lines WL0 to WL7 in this order from the semiconductor substrate 20 side. The conductor 23 contains, for example, tungsten (W). In the following, the region in which the conductor 23 is provided will also be referred to as a W region.

An insulating layer (e.g., an insulating layer 26 in FIGS. 11 and 14) and the conductor 24 are alternately stacked on the conductor 23. The conductor 24 is formed, for example, in a plate shape which spreads along the XY plane. The plurality of stacked conductors 24 are respectively used as the select gate lines SGDa to SGDc in this order from the semiconductor substrate 20 side. The conductor 24 contains, for example, tungsten (W).

The conductor 25 is provided on the conductor 24 via an insulating layer (e.g., an insulating layer 26 in FIGS. 11 and 14). The conductor 25 is formed, for example, in a linear shape extending in the Y direction, and is used as the bit line BL. In other words, a plurality of conductors 25 are arranged in the X direction in a region (not illustrated). The conductor 25 contains, for example, copper (Cu).

The memory pillar MP is formed in a columnar shape extending in the Z direction, and penetrates through, for example, the conductors 22 to 24. Specifically, for example, the upper end of the memory pillar MP is placed in a layer between the layer in which the conductor 24 is provided and the layer in which the conductor 25 is provided. A lower end of the memory pillar MP is included in, for example, the layer in which the conductor 21A is provided. In other words, the lower end of the memory pillar MP is in contact with the conductor 21A instead of penetrating through the conductor 21A.

The memory pillar MP includes, for example, a core member 30, a conductor 31, and a stacked film 32. The core member 30 is formed in a columnar shape extending in the Z direction. For example, the upper end of the core member 30 is placed in a layer between the layer in which the uppermost conductor 24 is provided and the upper end of the memory pillar MP. The lower end of the core member 30 is placed in, for example, the layer in which the conductor 21A is provided. The core member 30 contains an insulator such as silicon dioxide ($SiO_2$).

The core member 30 is covered with the conductor 31. The conductor 31 has a portion in contact with the conductor 21A in the layer in which the conductor 21A is provided, and is electrically connected to the conductor 21A. The conductor 31 is, for example, poly-silicon (Si). A side surface and a lower surface of the conductor 31 are covered with the stacked film 32 except for a portion thereof where the conductors 21A and 31 are in contact with each other.

Figure 8:
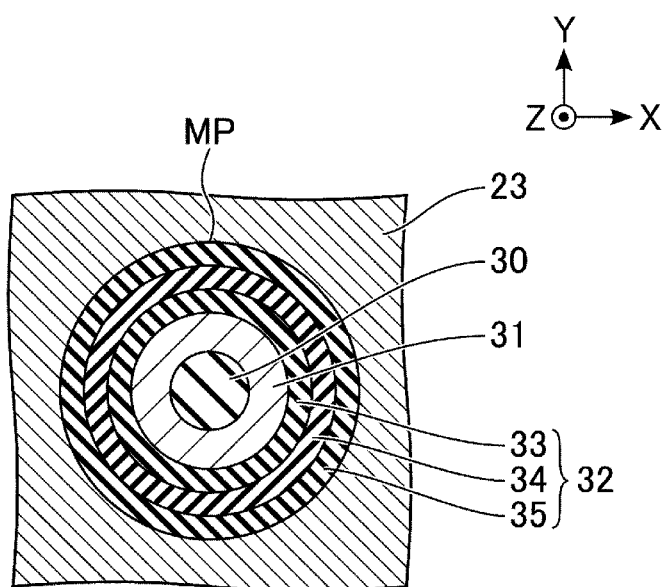
FIG. 8 illustrates a cross-sectional view of an example of a memory pillar in the semiconductor memory according to the first embodiment.

FIG. 8 illustrates an example of a cross-sectional structure of the memory pillar MP in a section parallel to a front surface of the semiconductor substrate 20, including the conductor 23 used as the word line WL.

As illustrated in FIG. 8, the core member 30 is provided at the center of the memory pillar MP in the layer including the conductor 23. The conductor 31 covers the side surface of the core member 30. The stacked film 32 covers the side surface of the conductor 31. The stacked film 32 includes, for example, a tunnel oxide film 33, an insulating film 34, and a block insulating film 35.

The tunnel oxide film 33 covers the side surface of the conductor 31. The insulating film 34 covers a side surface of the tunnel oxide film 33. The block insulating film 35 covers a side surface of the insulating film 34. The conductor 23 covers a side surface of the block insulating film 35.

Referring to FIG. 7 again, the columnar contact CH is provided on an upper surface of the memory pillar MP, that is, on the conductor 31. An upper surface of the contact CH is in contact with a single conductor 25, that is, a single bit line BL.

The dummy memory pillars DMP is formed in a columnar shape extending in the Z direction, and penetrates through, for example, the conductors 22 to 24. A configuration of the dummy memory pillars DMP is the same as, for example, the configuration of the memory pillar MP, and thus a description thereof will be omitted.

The slit SLT is formed in a plate shape spreading along an XZ plane, and separates, for example, the conductors 22 to 24. Specifically, the upper end of the slit SLT is placed in, for example, the layer between the layer including the upper end of the memory pillar MP and the layer in which the conductor 25 is provided. The lower end of the slit SLT is placed in, for example, the layer in which the conductor 21A is provided. In other words, for example, the lower end of the slit SLT is in contact with the conductor 21A instead of penetrating through the conductor 21A. The slit SLT contains an insulator such as silicon dioxide (SiO$_2$).

The slit SHE is formed in a plate shape spreading along the XZ plane, and separates, for example, the conductor 24 and a part of the dummy memory pillars DMP. Specifically, the upper end of the slit SHE is placed in, for example, the layer between the layer including the upper end of the memory pillar MP and the layer in which the conductor 25 is provided. The lower end of the slit SHE is placed, for example, between the layer in which the uppermost conductor 23 is provided and the layer in which the lowermost conductor 24 is provided. The slit SHE may separate at least all of the conductors 24 provided in the region. The slit SHE contains an insulator such as silicon dioxide (SiO$_2$).

In the above-described configuration of the memory pillar MP, for example, a portion where the memory pillar MP intersects the conductor 22 functions as the select transistor ST2. Respective portions where the memory pillar MP intersects the plurality of conductors 23 function as the memory cell transistors MT0 to MT7. Respective portions where the memory pillar MP intersects the plurality of conductors 24 function as the select transistors ST1a to ST1c.

In other words, the conductor 31 in the memory pillar MP functions as a channel of each of the memory cell transistor MT, and the select transistors ST1 and ST2. The insulating film 34 functions as a charge storage layer of the memory cell transistor MT.

Figure 9:
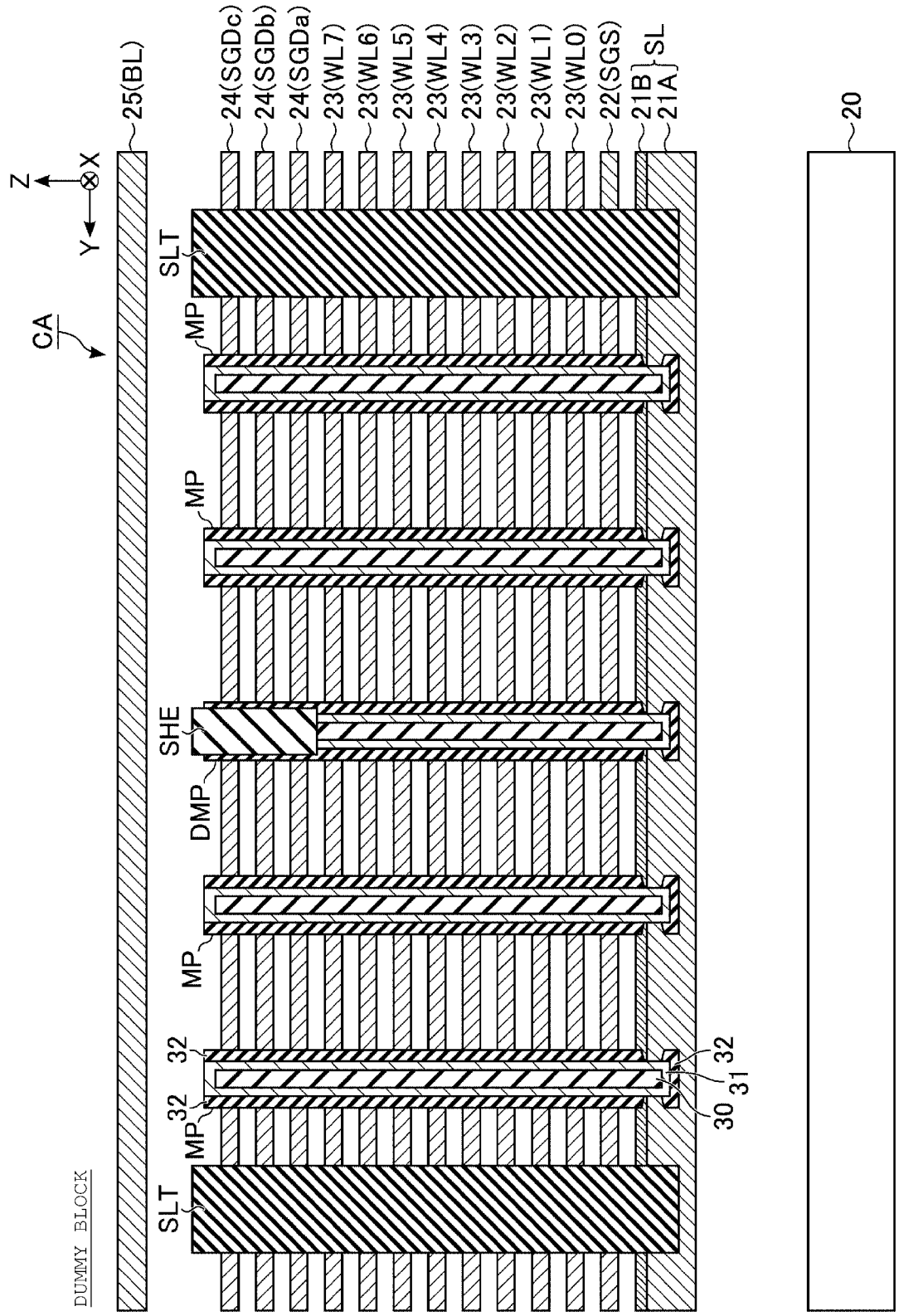
FIG. 9 illustrates a cross-sectional view of an example of the cell region of the memory cell array of the semiconductor memory according to the embodiment.

FIG. 9 illustrates an example of a cross-sectional structure of the memory cell array 10 in a region corresponding to the dummy block DBLK in the cell region CA.

As illustrated in FIG. 9, the region corresponding to the dummy block DBLK in the cell region CA includes, for example, the conductors 21A and 21B, and 22 to 25, the memory pillars MP, the dummy memory pillars DMP, and the slits SLT and SHE. The structure of the dummy block DBLK is the same as a structure in which, for example, the contact CH is omitted from the active block ABLK.

For example, the dummy block DBLK in the cell region CA does not preferably include the contact CH in the active block ABLK, but may include the contact CH. In other words, in the dummy block DBLK, the memory pillar MP may or not be electrically connected to the conductor 25.

In the active block ABLK, the memory pillar MP may be electrically connected to the conductor 25 via two or more contacts, and may be electrically connected thereto via other wirings. In this case, in the dummy block DBLK, the same contact and wiring as those in the active block ABLK may be formed between the memory pillar MP and the conductor 25, and a structure in which some of the contacts and the wirings provided in the active block ABLK are omitted may be formed. The memory pillar MP may be provided in the dummy block DBLK in the same as in the active block ABLK, and may not be provided.

Structure of Memory Cell Array 10 in Lead Region HA

Figure 10:
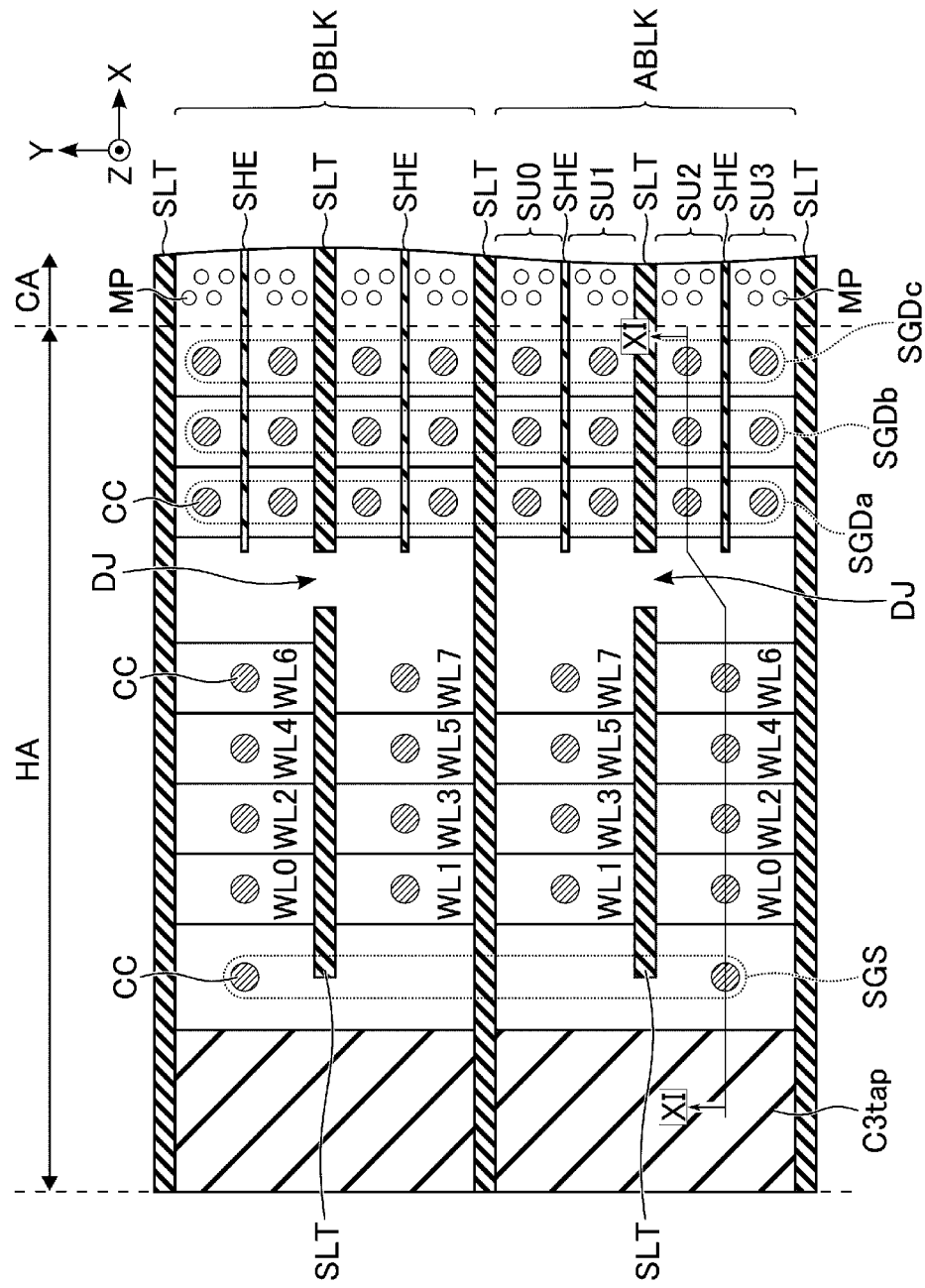
FIG. 10 illustrates a plan view of an example of a lead region of the memory cell array of the semiconductor memory according to the embodiment.

FIG. 10 illustrates an example of a planar layout of the lead region HA of the memory cell array 10 of the semiconductor memory 1 according to the embodiment by extracting one active block ABLK and one dummy block DBLK.

As illustrated in FIG. 10, in the region of the active block ABLK in the lead region HA, a plurality of conductors respectively corresponding to the select gate line SGS, the word lines WL0 to WL7, and the select gate line SGD have portions (terrace portions) not overlapping overlying conductors.

For example, a plurality of conductors 24 respectively corresponding to the select gate lines SGDa, SGDb, and SGDc are provided in a stepped form in which a step difference is formed in the X direction. In the lead region HA, the horizontal-direction slit SLT in the active block ABLK separates the select gate lines SGDa, SGDb, and SGDc. The slit SHE also separates the select gate lines SGDa, SGDb, and SGDc.

In this example, in the active block ABLK, each of the select gate lines SGDa, SGDb, and SGDc is separated into four lines by the slits SLT and SHE. The four separated select gate lines SGD (that is, a set of SGDa, SGDb, and SGDc) respectively correspond to the string units SU0 to SU3.

For example, a plurality of conductors 23 respectively corresponding to the word lines WL0 to WL7 have a step difference of one step in the Y direction and are provided in a stepped shape of two rows in which a step difference is formed in the X direction. The slit separation part DJ provided in the horizontal-direction slit in the active block ABLK is disposed in, for example, the terrace portion of the word line WL7. The word lines WL provided in an identical layer in the identical active block ABLK are short-circuited to each other via the slit separation part DJ.

The conductor 22 corresponding to the select gate line SGS is led in the X direction from, for example, end part regions of the word lines WL0 and WL1. The horizontal-direction slit SLT in the active block ABLK may or not separate the select gate line SGS.

In the active block ABLK, for example, contacts CC are provided in the terrace portions of the select gate line SGS, the word lines WL0 to WL7, and the select gate lines SGDa, SGDb, and SGDc.

For example, a C3 connection region C3tap is provided in an end part region in the X direction in a region between the two horizontal-direction slits SLT in contact with the active block ABLK. The C3 connection region C3tap is a region in which a contact (not illustrated) for connecting a wiring provided on the memory cell array 10 to a wiring provided under the memory cell array 10 is provided.

Each of the select gate line SGS, the word lines WL0 to WL7, and the select gate line SGD is electrically connected to the row decoder module 15 provided under the memory cell array 10 via a contact penetrating through the corresponding contact CC and the C3 connection region C3tap.

The C3 connection region C3tap may be provided outside the region interposed between the horizontal-direction slits SLT. In the lead region HA, the horizontal-direction slit SLT provided between the blocks BLK adjacent to each other may separate at least the conductor 22 corresponding to the select gate line SGS. Thus, the C3 connection region C3tap interposed between the horizontal-direction slits SLT may not be provided depending on a layout of the memory cell array 10.

The rest of the planar layout of the dummy block DBLK in the lead region HA is the same as a planar layout obtained by reversing the planar layout of the active block ABLK adjacent thereto, and thus a description thereof will be omitted.

FIG. 11 illustrates a cross-sectional view of the memory cell array 10 taken along the line IX-IX in FIG. 10, and illustrates an example of a cross-sectional structure of the memory cell array 10 in the region corresponding to the active block ABLK in the lead region HA.

As illustrated in FIG. 11, the region corresponding to the active block ABLK in the lead region HA includes, for example, the conductors 21A and 21B, and 22 to 24, conductors 40 to 44, and contacts CC, V1, and C3.

The end part of each of the conductor 22, the conductor 23, and the conductor 24 respectively corresponding to the select gate line SGS, the word line WL, and the select gate line SGD is provided in a stepped form as described above. In other words, in the lead region HA, each end part of the conductors 22 to 24 has at least a portion not overlapping the overlying conductor 23 or conductor 24.

The end part of the conductor 21B is led to the outside of the conductor 22 in the lead region HA. In other words, in a plan view, the region in which the conductor 21B includes the region in which the conductor 22 is provided. The end part of the conductor 21A is provided further inward than, for example, the conductor 21B. The conductor 21A may be provided in at least the cell region CA.

Each contact CC is formed in a columnar shape extending in the Z direction. The contact CC includes, for example, a conductor formed in a columnar shape. A spacer may be provided on a side surface of the columnar conductor provided in the contact CC. The conductor in the contact CC contains, for example, tungsten (W), and the spacer contains, for example, silicon dioxide ($SiO_2$). In an embodiment, a contact CC in the plane PN1 (see FIG. 3) may be referred to as a columnar first contact, and a contact CC in the plane PN2 (see FIG. 3) may be referred to as a columnar second contact.

The respective conductors 40 to 44 are wirings connecting the conductors 22 to 24 led to the lead region HA from the cell region CA above-described the row decoder module 15 to each other. A plurality of conductors 40 are respectively provided on a plurality of contacts CC. A plurality of contacts V1 are respectively provided on the plurality of conductors 40. A plurality of conductors 41 are respectively provided on the plurality of contacts V1.

The conductor 41 is electrically connected to, for example, the corresponding conductor 42. The conductor 42 is electrically connected to the conductor 43 provided in the same layer as the conductor 40 via, for example, the contact V1 in the C3 connection region C3tap. The conductor 43 is electrically connected to the conductor 44 provided in a lower layer of the conductor 21 via, for example, the contact C3 in the C3 connection region C3tap. The conductor 44 is electrically connected to the row decoder module 15 via a contact and a wiring (not illustrated).

The conductors 40 and 43 may be formed in an identical layer, and may be formed in different layers. The conductors 41 and 42 may be formed in an identical layer, and may be formed in different layers. The corresponding conductors 40 and 41 may be connected to each other via a plurality of contacts, and different wirings may be connected to each other among a plurality of contacts.

In FIG. 11, the placement of the slit SHE provided in the depth direction of the cross-sectional view is illustrated by a dashed line. As illustrated in FIG. 11, the slit SHE in the active block ABLK is provided to separate the plurality of conductors 24 respectively corresponding to the select gate lines SGDa, SGDb, and SGDc in the lead region HA.

Figure 12:
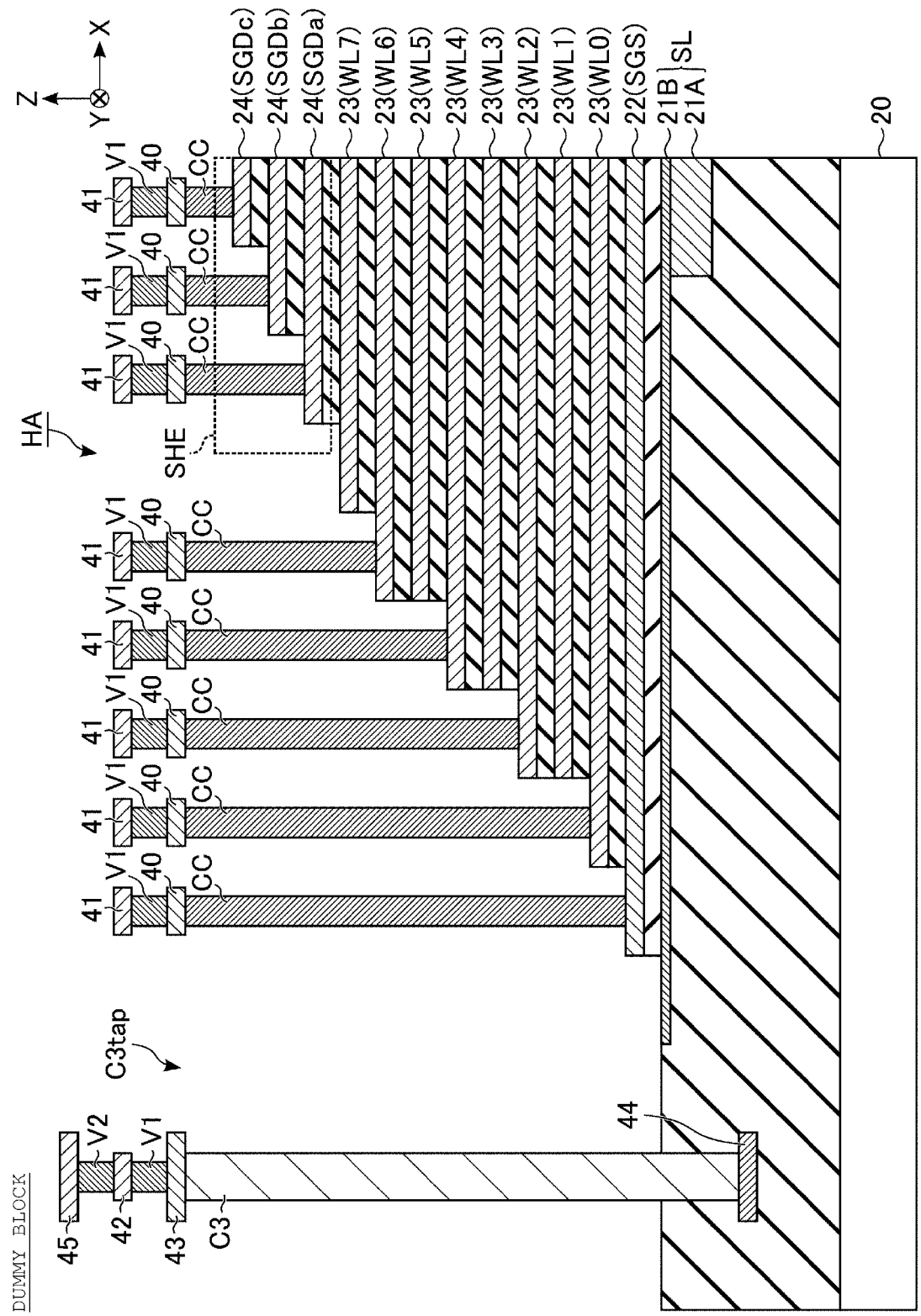
FIG. 12 illustrates a cross-sectional view of an example of the lead region of the memory cell array of the semiconductor memory according to the embodiment.

FIG. 12 illustrates an example of a cross-sectional structure of the memory cell array 10 in the region corresponding to the dummy block DBLK in the lead region HA.

As illustrated in FIG. 12, the region corresponding to the dummy block DBLK in the lead region HA includes, for example, the conductors 21A and 21B, and 22 to 24, the conductors 40 to 45, and the contacts CC, V1, V2, and C3.

The conductor 45 is used as, for example, a micro-pad. The micro-pad is a pad used in, for example, an inspection process. The conductor 45 is electrically connected to the corresponding conductor 42 via the contact V2. In other words, various wirings led in the dummy block DBLK are electrically connected to, for example, the micro-pad.

In FIG. 12, the placement of the slit SHEs provided in the depth direction of the cross-sectional view is illustrated by a dashed line. As illustrated in FIG. 12, in the lead region HA, the slit SHEs in the dummy block DBLK is provided to separate the plurality of conductors 24 respectively corresponding to the select gate lines SGDa, SGDb, and SGDc.

The rest of the structure of the dummy block DBLK in the lead region HA is the same as, for example, the structure of the active block ABLK in the lead region HA, and thus a description thereof will be omitted.

The conductors 45 and 42 may be connected to each other via position contacts and wirings. The conductor 45 may be exposed to a chip surface of the semiconductor memory 1. The various wirings led in the dummy block DBLK may or may not be connected to circuits provided in a lower layer of the conductor 21. In other words, in the dummy block DBLK, the conductors 43 and 44, and the contact C3 may be omitted.

In the above description, a description has been made of an exemplary case where the word line WL of the active block ABLK is connected to the row decoder module 15 under the memory cell array 10 via the C3 connection region C3tap, but this is only an example. For example, the contact CC connected to the end part of the conductor 23 (that is, the word line WL) may be electrically connected to the row decoder module 15 under the memory cell array 10 via a contact which penetrates through stacked wirings (for example, a plurality of conductors 23) of the dummy block DBLK in the lead region HA.

The contact CC connected to the end part of the conductor 23 may be electrically connected to the row decoder module 15 under the memory cell array 10 via a contact which penetrates through stacked wirings (for example, a plurality of conductors 23) of the active block ABLK in the lead region HA. In a case where the horizontal-direction slit SLT is provided at the other end part of the block group BLKG in the X direction, the C3 connection region C3tap may be provided in a region outside the region surrounded by the vertical-direction slit and the horizontal-direction slit.

Structure of Memory Cell Array 10 in Vicinity of Plane Separation Region PNdiv

Figure 13:
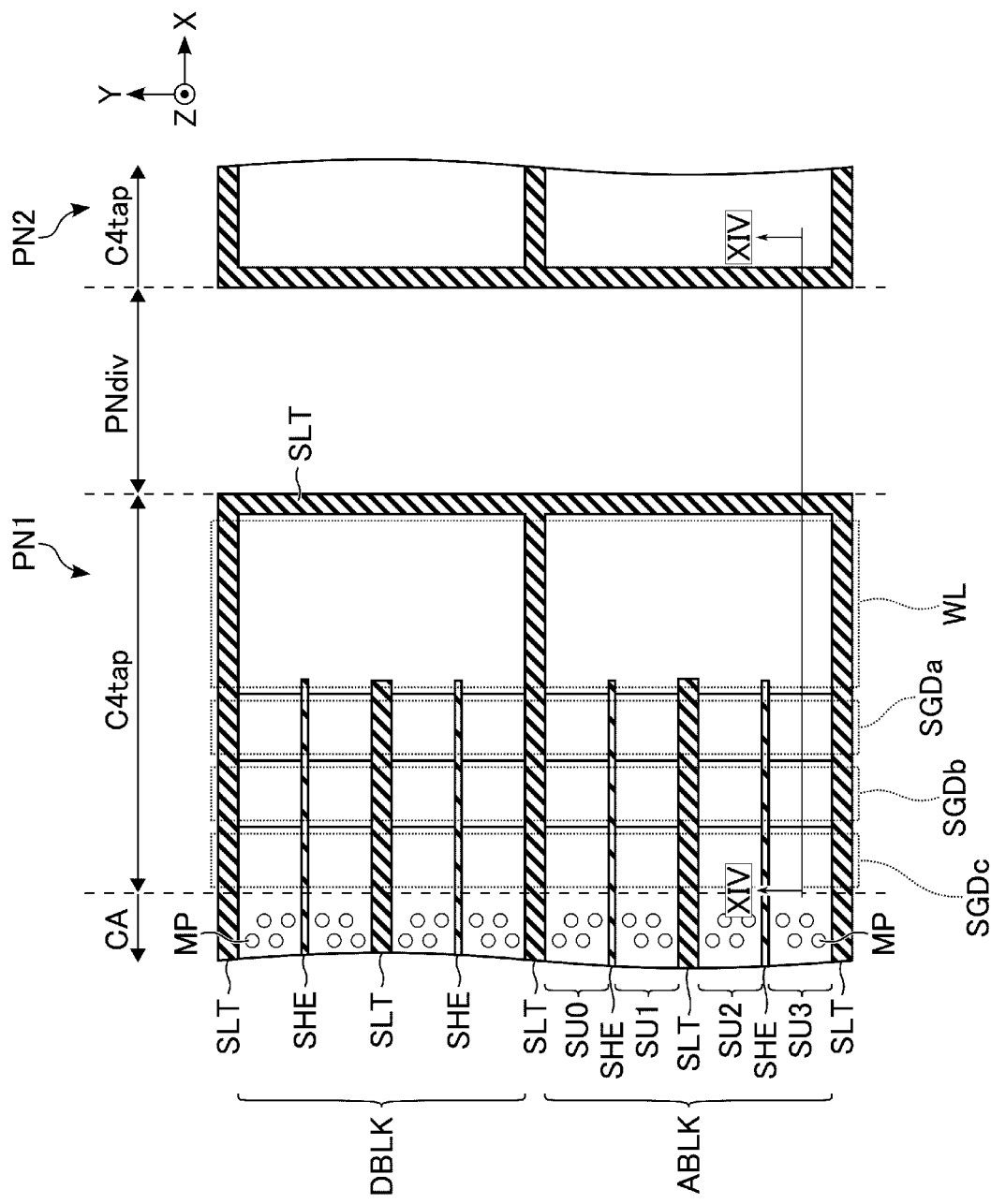
FIG. 13 illustrates a plan view of an example of the vicinity of a plane separation region of the semiconductor memory according to the embodiment.

FIG. 13 illustrates an example of a planar layout of the vicinity of the plane separation region PNdiv of the semiconductor memory 1 according to the embodiment by extracting one active block ABLK and one dummy block DBLK. In the following, the C4 connection region C4tap of the plane PN1 will be focused.

As illustrated in FIG. 13, in the C4 connection region C4tap, a plurality of conductors 24 respectively corresponding to the select gate lines SGDa, SGDb, and SGDc and the conductor 23 corresponding to the uppermost word line WL have portions (terrace portions) not overlapping overlying conductors.

For example, in the active block ABLK, the plurality of conductors 24 respectively corresponding to the select gate lines SGDa, SGDb, and SGDc are provided in a stepped form in which a step difference is formed in the X direction. In the C4 connection region C4tap, the horizontal-direction slit SLT in the active block ABLK separates the select gate lines SGDa, SGDb, and SGDc. Similarly, the slit SHE separates the select gate lines SGDa, SGDb, and SGDc.

The horizontal-direction slit SLT disposed in the active block ABLK is not in contact with the vertical-direction slit SLT. In other words, the word lines WL provided in an identical layer in the C4 connection region C4tap are short-circuited to each other in the string units SU0 to SU3.

The rest of the planar layout of the dummy block DBLK in the C4 connection region C4tap is the same as a planar layout obtained by reversing the planar layout of the active block ABLK adjacent thereto, and thus a description thereof will be omitted.

FIG. 14 illustrates a cross-sectional view of the memory cell array 10 taken along the line XIV-XIV in FIG. 13, and illustrates an example of a cross-sectional structure of the memory cell array 10 including a region corresponding to the active block ABLK in the vicinity of the plane separation region PNdiv. In the following, the C4 connection region C4tap of the plane PN1 will be focused.

As illustrated in FIG. 14, the region corresponding to the active block ABLK in the C4 connection region C4tap includes, for example, the conductors 21A and 21B, and 22 to 24, conductors 47, 48, and 50, and contacts CS and C4.

The end part of the conductor 21A in the plane PN1 extends, for example, from the cell region CA to the middle of the C4 connection region C4tap. On the other hand, the end part of the conductor 21B extends, for example, to the middle of the plane separation region PNdiv, and is separated by the vertical-direction slit SLT. The same is true for the conductor 21B in the plane PN2. The end part of the conductor 21B that extends from the plane PN1 and is provided in the plane separation region PNdiv may be referred to as a first conductive layer 21B-1. The end part of the conductor 21B that extends from the plane PN2 and is provided in the plane separation region PNdiv may be referred to as a second conductive layer 21B-2.

The conductor 21B corresponding to the plane PN1 and the conductor 21B corresponding to the plane PN2 are separated from each other in the plane separation region PNdiv. In other words, an insulator is provided between the conductor 21B of the plane PN1 and the conductor 21B of the plane PN2.

In the following, the region in which the conductor 21B of the plane PN1 and the conductor 21B of the plane PN2 are separated from each other will be referred to as a source line separation region DPdiv. In other words, the source line separation region DPdiv is provided in the region between the region in which the conductor 21B of the plane PN1 is provided and the region in which the conductor 21B of the plane PN2 is provided.

Each of the conductors 22 and 23 are separated by the vertical-direction slit SLT, and is in contact with the vertical-direction slit SLT. A plurality of conductors 24 respectively corresponding to the select gate lines SGDa, SGDb, and SGDc are provided, for example, in a stepped form in the same manner as in the lead region HA. This is only an example, and, in the C4 connection region C4tap, the plurality of conductors 24 respectively corresponding to the select gate lines SGDa, SGDb, and SGDc may not be provided in a stepped form. In an embodiment, the conductor 21B, the insulating layers 26, and the conductors 23 in the plane PN1 may be referred to as a first conductor, first insulators, and second conductors, respectively, and a group thereof may be referred to as a first stacked body. Similarly, the conductor 21, the insulating layers 26, and the conductors 23 in the plane PN2 may be referred to as a third conductor, second insulators, and fourth conductors, respectively, and a group thereof may be referred to as a second stacked body.

In the C4 connection region C4tap, the columnar contact CS is provided on the conductor 21, and the contact CS includes a conductor 46 and a spacer SP. The conductor 46 is provided in a columnar shape, and a lower end thereof is in contact with the conductor 21B. The conductor 46 is not limited thereto, and the lower end thereof may be placed in the layers in which the conductors 21A and 21B are provided, and may be in contact with the conductor 21A. The spacer SP is provided on a side surface of the conductor 46.

The conductor 47 is provided on the contact CS, that is, on the conductor 46. The conductor 47 is electrically connected to, for example, the conductor 48 provided in an identical layer in the C4 connection region C4tap.

The conductor 48 is electrically connected to the conductor 50 provided in a lower layer of the conductor 21 via the contact C4. The contact C4 includes a conductor 49 and a spacer SP, and penetrates through, for example, the conductors 21B, 22, and 23. The conductor 49 is provided in a columnar shape, and has a lower end in contact with the conductor 50 and an upper end in contact with the conductor 48. The spacer SP is provided on a side surface of the conductor 49. The conductor 50 is electrically connected to a circuit provided under the memory cell array 10.

In FIG. 14, a set of the contacts CS and C4 is illustrated, but the C4 connection region C4tap may include a plurality of contacts CS and C4, and may include a plurality of conductors 47, 48, and 50. In this case, the conductor 21 is electrically connected to the corresponding conductor 50 via a combination of the contacts CS and C4 and the conductors 47 and 48.

A wiring layer in which the conductor 23 is provided includes a region (for example, an ON region) in which insulators 51 are provided, in the region (that is, the plane separation region PNdiv) between the vertical-direction slit corresponding to the plane PN1 and the vertical-direction slit corresponding to the plane PN2. The insulators 51 are provided in a portion separated from the slit SLT. Each of the insulators 51 contains, for example, silicon nitride (SiN).

In an embodiment, the first conductive layer 21B-1, the insulating layers 26, and the conductors 23 in a region between the ON region and the slit SLT adjacent to the plane PN1 may be referred to as a fifth conductor, fourth insulators, and sixth conductors, respectively, and a group thereof may be referred to as a third stacked body. Similarly, the second conductive layer 21B-2, the insulating layers 26, and the conductors 23 in a region between the ON region and the slit SLT adjacent to the plane PN2 may be referred to as a seventh conductor, fifth insulators, and eighth conductors, respectively, and a group thereof may be referred to as a fourth stacked body. Further, the slit SLT adjacent to the plane PN1 and the slit SLT adjacent to the plane PN2 may be referred to as a third insulator and a sixth insulator, respectively. Furthermore, a portion of the source line separation region DPdiv, insulating layers 26, and the insulators 51 in the ON region may be referred to as a seventh insulator, eighth insulators, and ninth insulators, respectively, and a group thereof may be referred to as a fifth stacked body.

In FIG. 14, the placement of the slit SHE provided in a depth direction of the cross-sectional view is illustrated by a dashed line. As illustrated in FIG. 14, the slit SHE in the active block ABLK is provided to separate the plurality of conductors 24 respectively corresponding to the select gate lines SGDa, SGDb, and SGDc in the C4 connection region C4tap.

Figure 15:
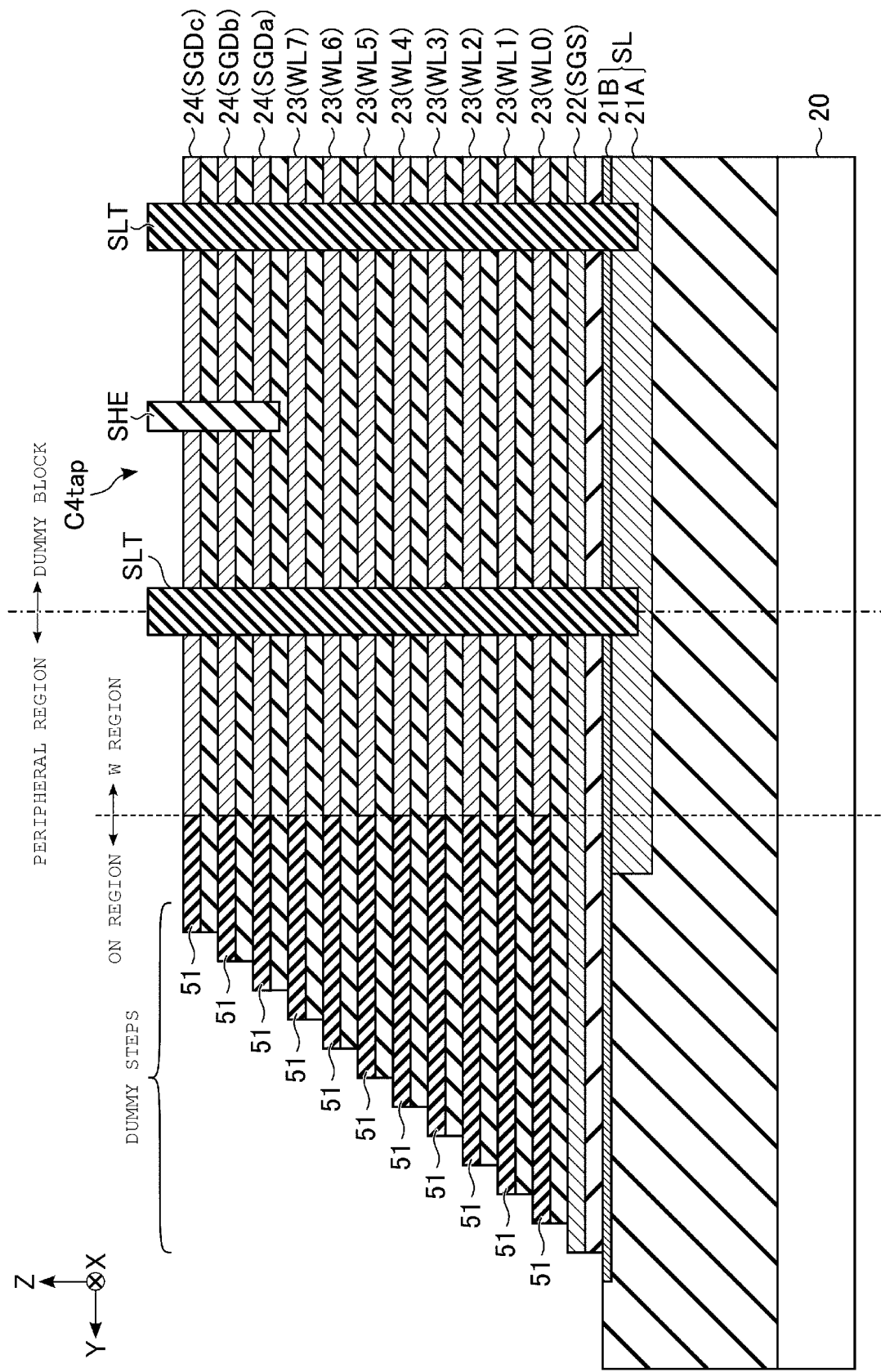
FIG. 15 illustrates a cross-sectional view of an example of the memory cell array in a region including a dummy block and a peripheral region of a block group in the semiconductor memory according to the embodiment.

FIG. 15 is a cross-sectional view of the memory cell array 10 along the Y direction, and illustrates an example of a cross-sectional structure of the memory cell array 10 including a peripheral region of the block group BLKG and a region of the dummy block DBLK.

As illustrated in FIG. 15, each of the conductors 22, 23, and 24 is separated by the slit SLT between the dummy block DBLK and the peripheral region of the block group BLKG. In other words, each of the conductors 23 corresponding to the word lines WL0 to WL7 provided in the dummy block DBLK is insulated from the conductor 23 provided in an identical layer in the peripheral region.

An ON region is formed in a portion of the peripheral region separated from the slit SLT. Specifically, in the ON region, insulators 51 are provided in layers in which the conductors 23 and 24 are provided. For example, dummy steps are formed in the peripheral region. The dummy steps are stepped portions formed when stepped portions of the lead region HA are processed. In this example, the dummy steps are formed in the ON region of the peripheral region, and a plurality of insulators 51 are provided in a stepped form.

In the peripheral region, the end part of the conductor 21B is led to, for example, the outside of the dummy steps. In other words, in a plan view, the region in which the conductor 21B is provided includes the region in which the conductor 22 is provided. This is only an example, and a region in which the conductor 21B is provided may include at least a region in which the W region is formed in a plan view.

The end part of the conductor 21A is provided further inward than the end part of the conductor 21B. The conductor 21A may be provided up to at least a location in contact with the horizontal-direction slit SLT between the dummy block DBLK and the peripheral region, and a range thereof formed in the peripheral region may be designed to be any range.

The rest of the structure of the dummy block DBLK in the C4 connection region C4tap is the same as, for example, the structure of the active block ABLK in the C4 connection region C4tap, and thus a description thereof will be omitted. In the above description, the structure of the memory cell array 10A corresponding to the plane PN1 has been described, and a structure of the plane PN2 is the same as a structure obtained by reversing, for example, the structure of the plane PN1 with the Y direction as a symmetry axis, and thus a description thereof will be omitted.

Figure 16:
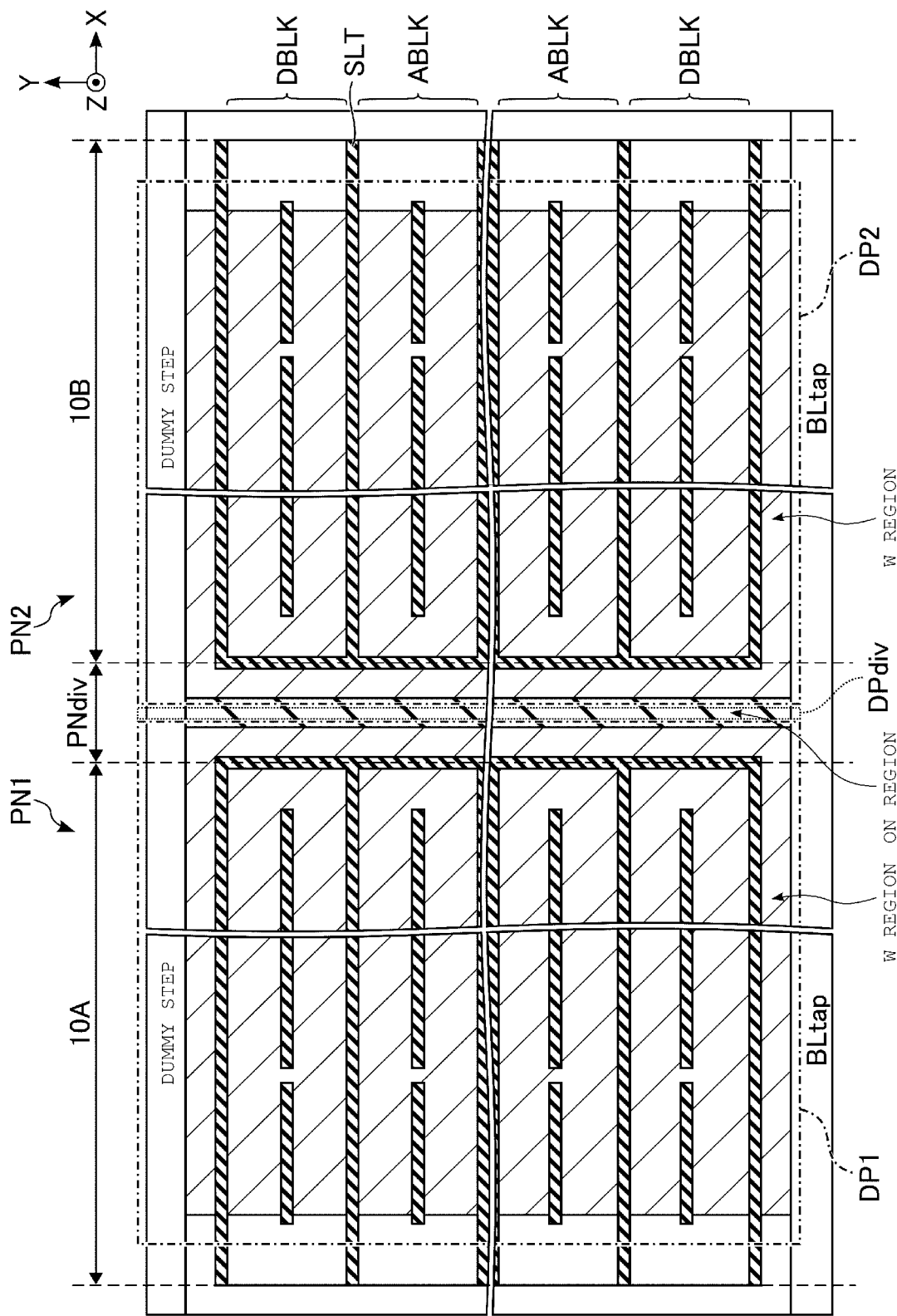
FIG. 16 illustrates a plan view of an example of the memory cell array according to the embodiment.

FIG. 16 illustrates a planar layout of the memory cell array 10 by extracting each of the block groups BLKG adjacent to each other between the planes PN1 and PN2. In FIG. 16, the ON region and the W region in the regions are hatched differently. The W region illustrated in FIG. 16 corresponds to a region in which, for example, the conductor 23 corresponding to the word line WL0 is provided.

As illustrated in FIG. 16, for example, the block groups BLKG adjacent to each other between the planes PN1 and PN2 are interposed between the region of the dummy steps provided on one side in the Y direction and the BL connection region BLtap provided on the other side in the Y direction. In other words, the W region provided in each of the planes PN1 and PN2 is, for example, in contact with the region of the dummy steps on one side in the Y direction and is in contact with the BL connection region BLtap on the other side in the Y direction. In the plane separation region PNdiv, the W region of each of the planes PN1 and PN2 is provided along the vertical-direction slit SLT in contact with the plane separation region PNdiv.

The ON region is provided between the W region of the plane PN1 and the W region of the plane PN2. As described above, in the embodiment, the conductor 23 in the plane PN1 is insulated from the conductor 23 in the plane PN2. The above-described structure is similarly formed for the other word lines WL1 to WL7.

FIG. 16 illustrates a region DP1 in which the conductor 21B corresponding to the plane PN1 is provided and a region DP2 in which the conductor 21B corresponding to the plane PN2 is provided. The source line separation region DPdiv is provided between the region DP1 and the region DP2, and the regions DP1 and DP2 are separated from each other.

In the structure of the memory cell array 10 described above, the number of conductors 23 is designed based on the number of word lines WL. A plurality of conductors 22 provided in a plurality of layers may be allocated to the select gate lines SGS. In a case where the select gate lines SGS are provided in a plurality of layers, a conductor which is different from the conductor 22 may be used.

A region of dummy steps may be provided between the dummy block DBLK and the BL connection region BLtap provided on the other side in the Y direction. For example, in a case where a region of dummy steps is not provided between the dummy block DBLK and the BL connection region BLtap, for example, the same stacked structure as in the ON region is formed in the BL connection region. In this case, for example, the contact C4 penetrating through the stacked structure is provided in the BL connection region BLtap, and thus the bit line BL is electrically connected to a wiring under the memory cell array 10.

On the other hand, in a case where a region of dummy steps is provided between the dummy block DBLK and the BL connection region BLtap, for example, the same insulating layer as in the C3 connection region C3tap is formed in the BL connection region. In this case, for example, the contact C3 penetrating through the insulating layer is provided in the BL connection region BLtap, and thus the bit line BL is electrically connected to a wiring under the memory cell array 10.

1-2. Effect of Embodiment

According to the semiconductor memory 1 of the embodiment described above, it is possible to improve data stored in a memory cell. In the following, details of the effect will be described.

In a manufacturing process for a semiconductor memory in which memory cells are stacked in a three-dimensional manner, in a case where a stacked wiring such as the word line WL is formed, first, a stacked body in which a replacement member and an insulating film are alternately stacked is formed. For example, a slit for partitioning the block BLK is formed, and removal of the replacement member and formation of a conductor are performed in order by using the slit. Thereafter, for example, an insulator is buried in the slit. A stacked wiring formed through the replacement process is used as a wiring such as the word line WL connected to a NAND string.

Figure 17:
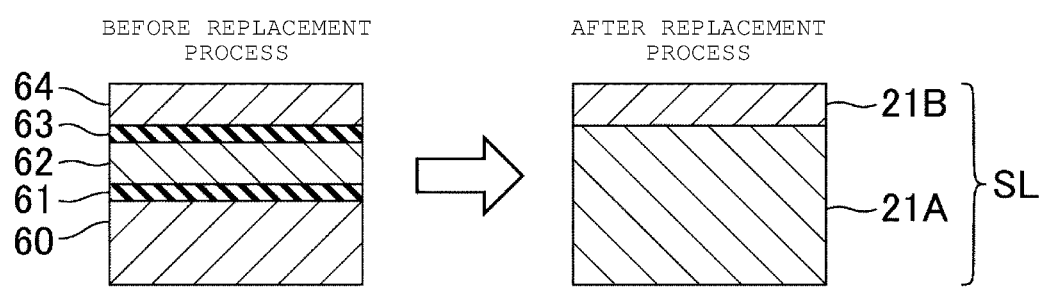
FIG. 17 illustrates a cross-sectional view of a source line portion illustrating an example of a method of forming a source line in the semiconductor memory according to the embodiment.

A slit used for a replacement process on the word line WL may also be used for a replacement process on the source line SL. FIG. 17 illustrates examples of stacked structures before and after a replacement process on the source line SL in a case where the source line SL is formed through the replacement process using a slit.

As illustrated in "before replacement process" FIG. 17, in a source line portion before a replacement process, for example, a conductor 60, an insulator 61, a sacrifice member 62 (also referred to as a replacement member 62), an insulator 63, and a conductor 64 are stacked in order. Each of the conductor 60, the insulator 61, the sacrifice member 62, the insulator 63, and the conductor 64 may be processed to a different shape in regions other than the cell region CA.

The conductors 60 and 64 are, for example, poly-silicon, and the conductor 64 corresponds to the conductor 21B. Each of the insulators 61 and 63 is, for example, silicon dioxide (SiO₂) or silicon nitride (SiN), and employs a material causing the etch selectivity to the sacrifice member 62 to be high. The sacrifice member 62 is, for example, poly-silicon.

In the stacked structure of the source line portion, a bottom part of the memory pillar MP is formed to be placed in, for example, a layer in which the conductor 60 is formed. A bottom part of a slit used for the replacement process is formed to be in contact with at least the sacrifice member 62.

In the replacement process on the source line SL, first, the sacrifice member 62 is removed via a slit, and the stacked film 32 formed on the exposed side surface part of the memory pillar MP is removed. In a process of removing the stacked film 32, for example, the insulators 61 and 63 are also removed. A conductor (for example, poly-silicon) corresponding to the source line SL is formed in a space from which the sacrifice member 62 and the insulators 61 and 63 are removed.

As a result, as illustrated in "after replacement process" in FIG. 17, for example, the conductor 21A is formed in the layers in which the conductor 60, the insulators 61 and 63, and the replacement member 62 are formed. Each of the conductors 21A and 21B is, for example, poly-silicon, and the conductors 21A and 21B are made of an identical material, and thus may be integrally formed.

The conductor 64 (that is, the conductor 21B) described above may be used as, for example, a protection film. Specifically, for example, in a process of removing the sacrifice member 62, the conductor 64 can prevent a short circuit failure between the source line SL and the select gate line SGS which may occur when a region near the conductor 22 is etched via the region from which the sacrifice member 62 is removed.

For that reason, the conductor 64 is preferably provided to protect stacked wirings close to the slit SLT. In other words, in the semiconductor memory 1, the conductor 21B is formed in a range wider than, for example, the conductor 22 corresponding to the lowermost wiring among the stacked wirings.

For example, in a case where planes are adjacent to each other and share a structural body of stacked wirings, there may be a structure in which the conductor 64 is continuously formed in the planes adjacent to each other or via peripheral regions of the planes, and thus the source lines SL are electrically connected to each other in the planes. Even in this case, the semiconductor memory is operable, but a noise component of the source line SL increases, and thus the reliability of data stored in a memory cell may be reduced.

In contrast, the slit SLT may be provided between planes adjacent to each other such that the conductors 21B of the planes adjacent to each other are separated from each other. However, also in this case, the conductor 21B is left without being separated in peripheral regions (for example, a region of dummy steps) of the planes, and the conductors 21B in the planes adjacent to each other are electrically connected to each other via the peripheral regions of the planes.

In the semiconductor memory 1 according to the embodiment, in a structure in which two planes PN1 and PN2 are adjacent to each other, the conductor 21B in the plane PN1 is provided separate from the conductor 21B in the plane PN2. Specifically, the region DP1 of the conductor 21B in the plane PN1 is separated from the region DP2 of the conductor 21B in the plane PN2 by the source line separation region DPdiv.

For example, the source line separation region DPdiv is formed, for example, after a stacked structure of the source line portion including the sacrifice member 62 is formed and before the conductor 22 corresponding to the select gate line SGS is provided. In other words, the regions DP1 and DP2 are separated from each other through an etching process which is different from processing on the slit SLT. In the semiconductor memory 1 according to the embodiment, the source line separation region DPdiv is formed in advance as described above, and thus the conductors 21B in the planes adjacent to each other can be reliably separated from each other.

Consequently, the semiconductor memory 1 according to the embodiment has a structure in which the conductors 21A and 21B in the plane PN1 are electrically insulated from the conductors 21A and 21B in the plane PN2. Therefore, the semiconductor memory 1 according to the embodiment can prevent an increase in a noise component of the source line SL and can thus improve the reliability of data stored in a memory cell.

The semiconductor memory 1 according to the embodiment has a structure in which the two planes PN1 and PN2 (that is, the memory cell arrays 10A and 10B) are adjacent to each other in the X direction. In the planes PN1 and PN2, the C4 connection region C4tap is provided in the portion in contact with the plane separation region PNdiv between the two planes PN1 and PN2. In other words, in the semiconductor memory 1 according to the embodiment, the lead region HA of each of the planes PN1 and PN2 is provided on only one side in the X direction.

As a result, in the semiconductor memory 1 according to the embodiment, it is possible to reduce an area occupied by the lead region HA compared with a case where two planes in which the lead regions HA have a stepped structure are adjacent to each other on both sides in the X direction. Therefore, the semiconductor memory 1 according to the embodiment can prevent an increase in the chip area of the semiconductor memory 1 having a plurality of planes.

2. Modification Example and the Like

The semiconductor memory of the embodiment includes first to seventh regions, first and second active regions, first to fourth stacked bodies, first and second contacts, and first and second pillars. The first to seventh regions are arranged in order on one side in a first direction. The first active region (for example, ABLK of 10A in FIG. 16) includes a part of each of the first to third regions. The second active region (for example, ABLK of 10B in FIG. 16) includes a part of each of the fifth to seventh regions. The first stacked body includes a first conductor (for example, 21B of PN1 in FIG. 14) in a first layer, and a first insulator and a second conductor alternately stacked on the first conductor, in the first active region. The second stacked body includes a third conductor (for example, 21B of PN2 in FIG. 14) in the first layer, and a second insulator and a fourth conductor alternately stacked on the third conductor, in the second active region. The first contact is provided in a columnar shape on a second conductor in a second layer among the stacked second conductors in the first region. The second contact is provided in a columnar shape on a fourth conductor in the second layer among the stacked fourth conductors in the seventh region. Each of a plurality of first pillars (for example, MP) penetrates through the stacked first conductors in the second region (for example, CA of PN1 in FIG. 3), and a portion thereof intersecting the first conductor functions as a memory cell. Each of a plurality of second pillars (for example, MP) penetrates through the stacked fourth conductors in the sixth region (for example, CA of PN2 in FIG. 3), and a portion thereof intersecting the fourth conductor functions as a memory cell. The third stacked body includes a fifth conductor adjacent to the first conductor via a third insulator (for example, SLT in FIG. 14) in the first layer of the fourth region, and a fourth insulator and a sixth conductor alternately stacked on the fifth conductor. The fourth stacked body includes a seventh conductor adjacent to the third conductor via a fifth insulator (for example, SLT in FIG. 14) in the first layer of the fourth region, and a sixth insulator and an eighth conductor alternately stacked on the seventh conductor. The fifth conductor is electrically insulated from the seventh conductor (for example, DPdiv in FIG. 14). Consequently, in the semiconductor memory according to the embodiment, it is possible to improve the reliability of data stored in a memory cell.

In the structure of the memory cell array 10 described in the embodiment, the memory pillar MP may have a structure in which a plurality of pillars are connected to each other in the Z direction. For example, the memory pillar MP may have a structure in which a plurality of pillars each penetrating through a plurality of conductors 23 are connected to each other in the Z direction. The memory pillar MP may have a structure in which a pillar penetrating through the conductors 22 and 23 and a pillar penetrating through the conductor 24 are connected to each other. In this case, the slit SLT does not separate, for example, the conductor 24, and the conductor 24 is separated by a slit which is different from the slit SLT.

In the embodiments, a description has been made of an exemplary case where the word lines WL form steps of two rows in the lead region HA, but this is only an example. For example, in the lead region HA, end parts of the word lines WL may be formed in a step of one row, and may be formed in steps of three or more rows.

In the embodiments, a description has been made of an exemplary case where the region of the memory cell array 10 includes a single C4 connection region C4tap, but a plurality of C4 connection regions C4tap may be provided in the cell region CA. The number of C4 connection regions C4tap inserted into the cell region CA may be designed to be any number.

In the embodiments, a description has been made of an example in which the contacts CS and C4 are provided in the C4 connection region C4tap adjacent to the plane separation region PNdiv, but the contacts CS and C4 may not be provided in the C4 connection region C4tap adjacent to the plane separation region PNdiv. At least a terrace portion of each select gate line SGD may be formed in the C4 connection region C4tap adjacent to the plane separation region PNdiv.

In the embodiment, a description has been made of an exemplary case where the W region of the plane PN1 and the W region of the plane PN2 are separated from each other in the plane separation region PNdiv, but the W region of the plane PN1 and the W region of the plane PN2 may be continuously formed.

Figure 18:
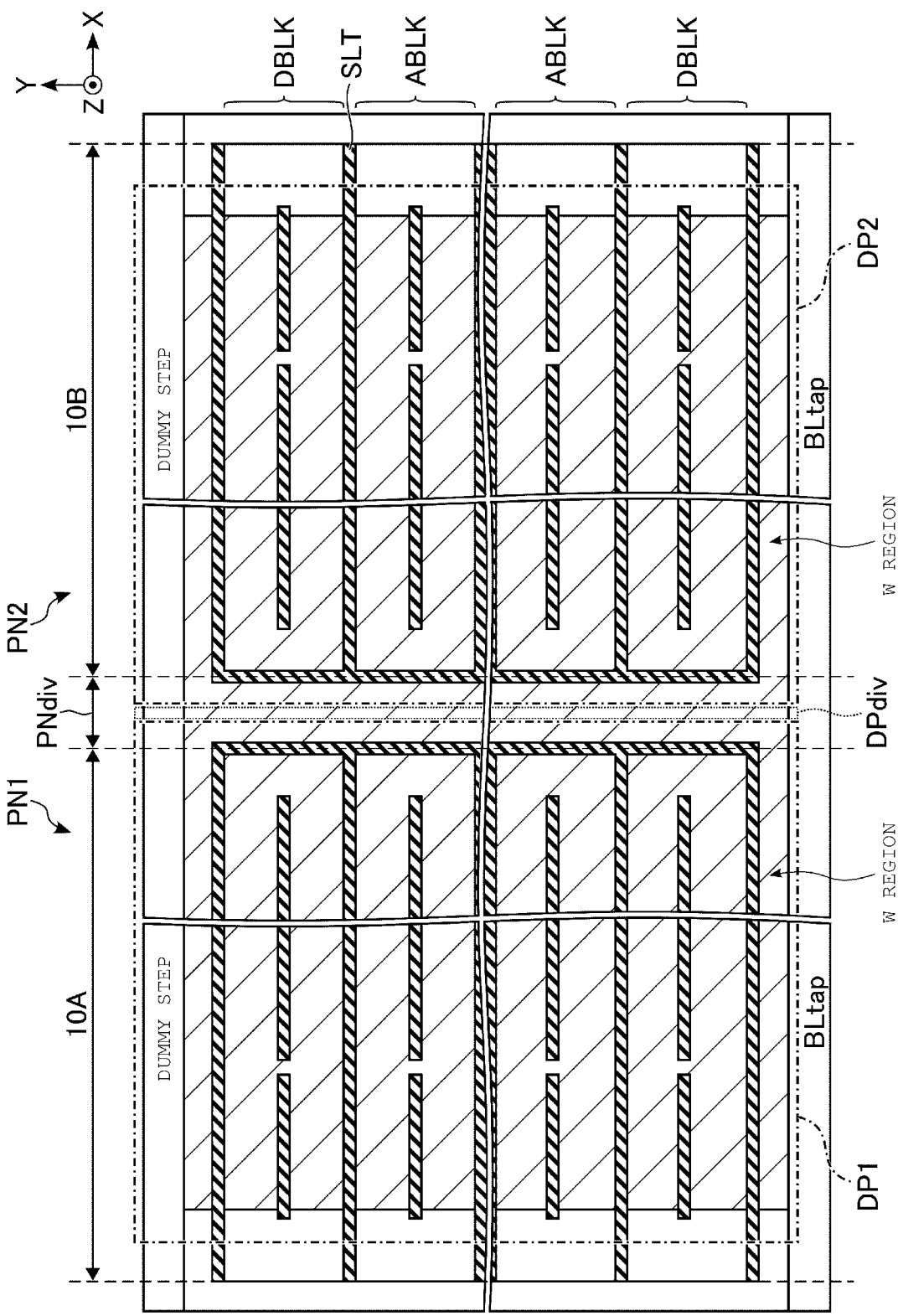
FIG. 18 illustrates a plan view of an example of a memory cell array in a first modification example of the embodiment.
Figure 19:
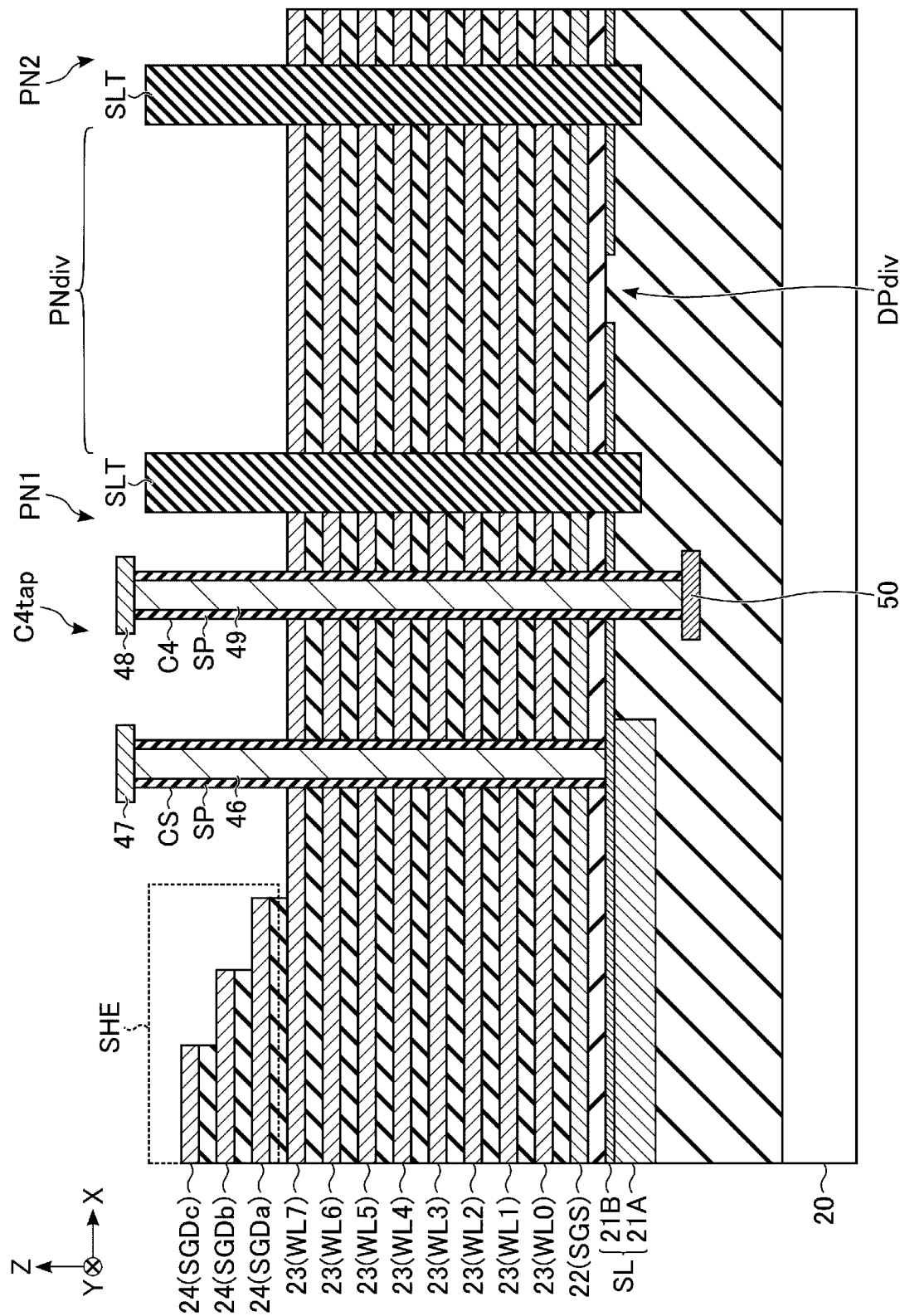
FIG. 19 illustrates a plan view of an example of the vicinity of a plane separation region in the first modification example of the embodiment.

FIG. 18 illustrates an example of a planar layout of the memory cell arrays 10A and 10B in a first modification example of the embodiment, and FIG. 19 illustrates a cross-sectional structure of the memory cell arrays 10A and 10B in the first modification example of the embodiment.

As illustrated in FIG. 18, in the first modification example, a gap between the memory cell array 10A corresponding to the plane PN1 and the memory cell array 10B corresponding to the plane PN2 is designed to be narrower than in the embodiment.

Thus, a gap between the vertical-direction slit SLT in the memory cell array 10A and the vertical-direction slit SLT in the memory cell array 10B is narrow, and thus the W region corresponding to the memory cell array 10A and the W region corresponding to the memory cell array 10B are continuously formed.

Specifically, as illustrated in FIG. 19, each conductor 23 provided in the plane separation region PNdiv is continuously provided between the vertical-direction slit SLT in contact with the plane PN1 and the vertical-direction slit SLT in contact with the plane PN2. Even in this case, in the semiconductor memory 1 in the first modification example, it is possible to achieve the same effect as in the embodiment by providing the source line separation region DPdiv in the same manner as in the embodiment.

Figure 20:
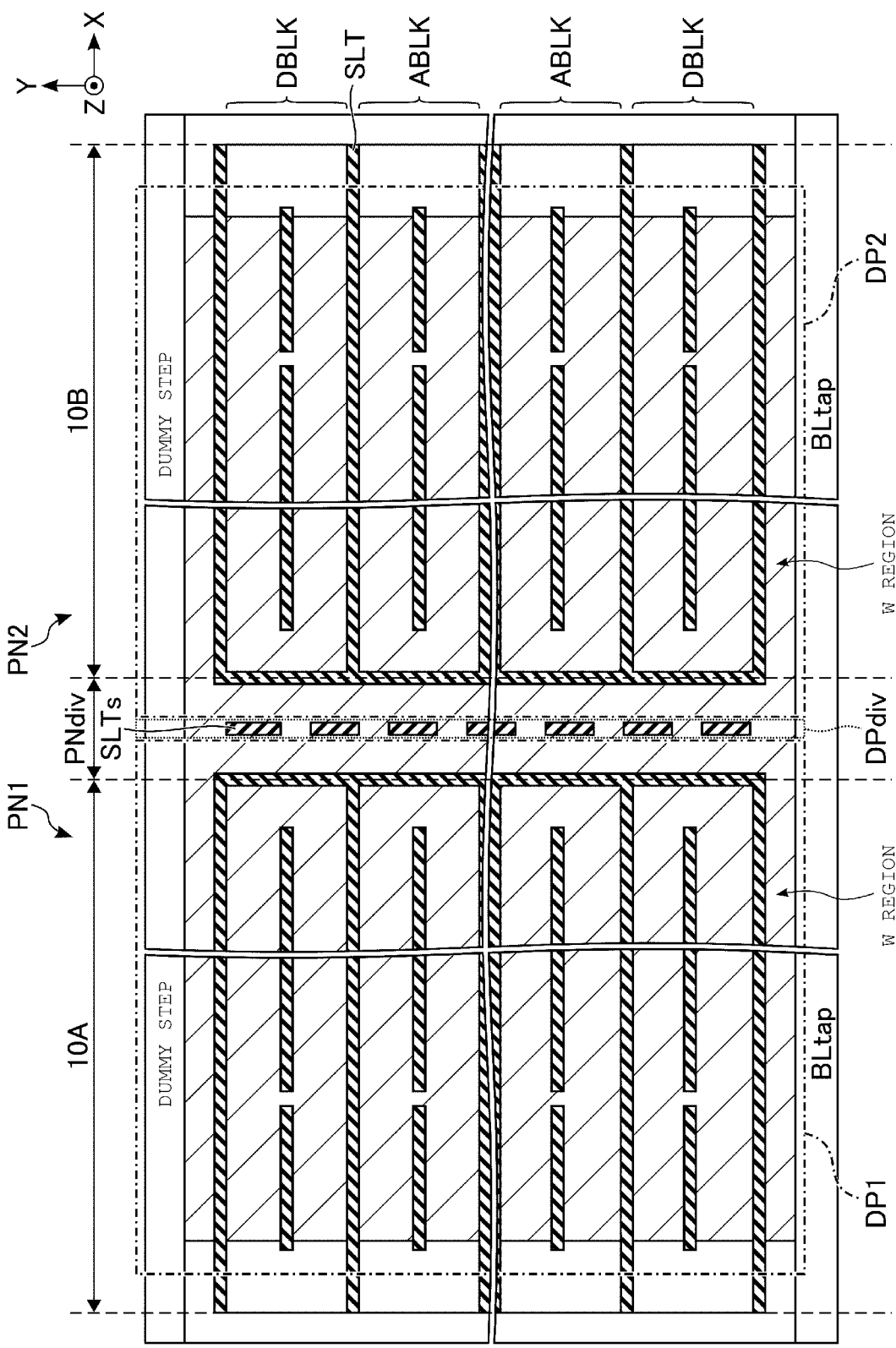
FIG. 20 illustrates a plan view of an example of a memory cell array in a second modification example of the embodiment.
Figure 21:
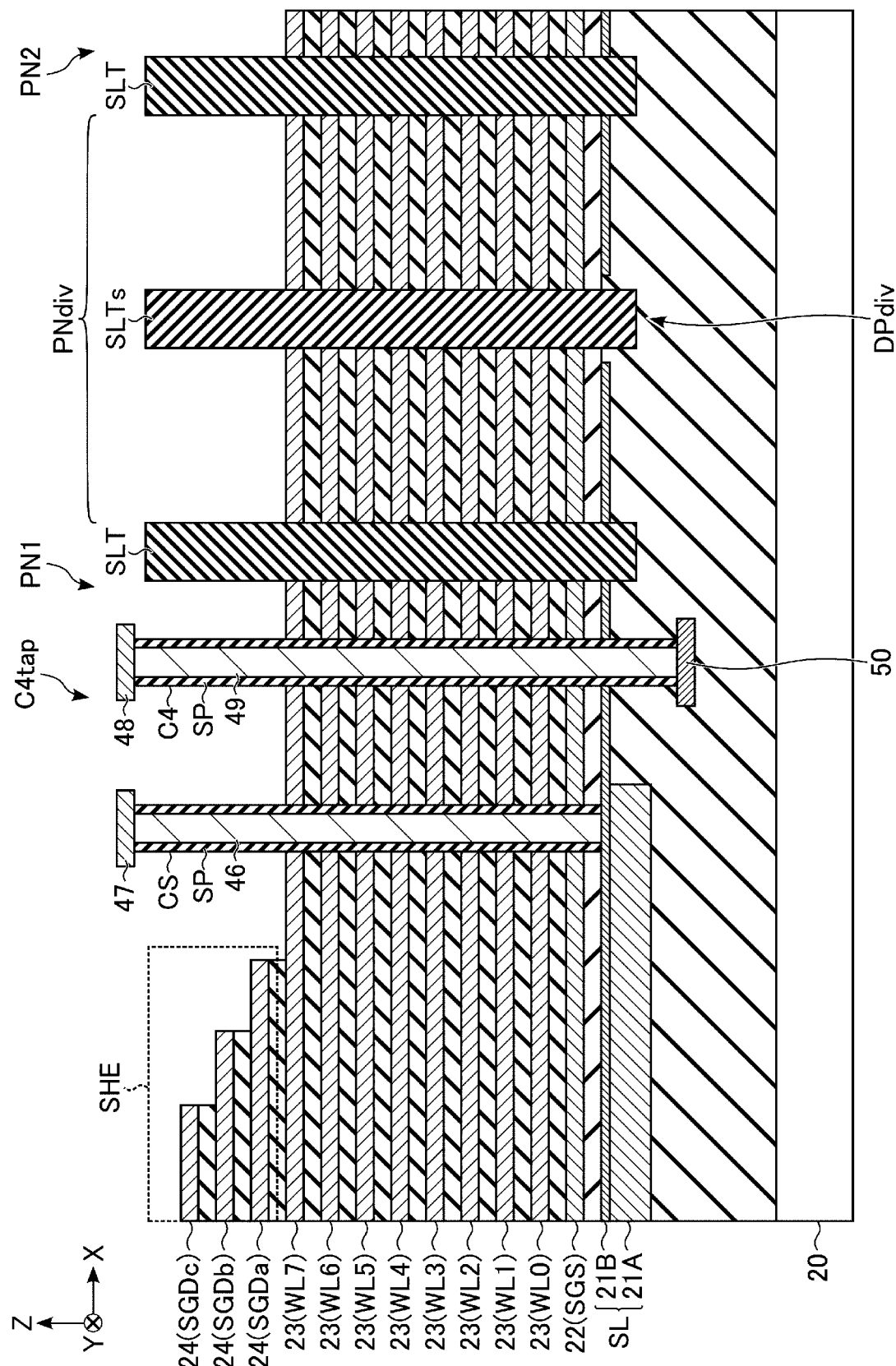
FIG. 21 illustrates a plan view of an example of the vicinity of a plane separation region in the second modification example of the embodiment.

FIG. 20 illustrates an example of a planar layout of the memory cell arrays 10A and 10B in a second modification example of the embodiment, and FIG. 21 illustrates a cross-sectional structure of the memory cell arrays 10A and 10B in the second modification example of the embodiment.

As illustrated in FIG. 20, in the second modification example, with respect to the semiconductor memory 1 according to the embodiment, a stitch-shaped slit SLTs is provided between the memory cell array 10A corresponding to the plane PN1 and the memory cell array 10B corresponding to the plane PN2.

Thus, the replacement member 62 between the vertical-direction slit SLT in the memory cell array 10A and the vertical-direction slit SLT in the memory cell array 10B is replaced with the conductor 23, and thus the W region corresponding to the memory cell array 10A and the W region corresponding to the memory cell array 10B are continuously formed.

Specifically, as illustrated in FIG. 21, for example, the slit SLTs is provided to pass through the source line separation region DPdiv. The slit SLTs is not limited thereto, and may be in contact with the conductor 21B of the memory cell array 10A, and may be in contact with the conductor 21B of the memory cell array 10B.

Even in this case, in the semiconductor memory 1 in the second modification example, it is possible to achieve the same effect as in the embodiment by providing the source line separation region DPdiv in the same manner as in the embodiment.

In the embodiment and the modification examples, a description has been made of an exemplary case where the source line separation region DPdiv is provided in the plane separation region PNdiv, but this is only an example. The source line separation region DPdiv may be formed in the C4 connection region C4tap close to the plane separation region PNdiv in the plane PN1, and may be formed in the C4 connection region C4tap close to the plane separation region PNdiv in the plane PN2.

In other words, the source line separation region DPdiv may be provided in at least a region between the cell region CA of the plane PN1 and the cell region CA of the plane PN2, so as to separate the conductor 21B between the planes PN1 and PN2.

In the semiconductor memory 1 according to the embodiment, whether the block BLK provided in the memory cell array 10 is the dummy block DBLK or the active block ABLK may be determined based on whether or not a block address BAd is allocated thereto.

Specifically, the block address BAd is not allocated to the dummy block DBLK, and the block address BAd is allocated to the active block ABLK. For example, in a case where blocks are accessed in order while increasing the block address BAd by one, the block BLK which is not accessed at all may be determined as being the dummy block DBLK.

The term "connection" in the present specification indicates that elements are electrically connected to each other, and includes that the elements are electrically connected to each other via other elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first conductive layers stacked above a substrate and spaced apart from each other in a first direction intersecting a surface of the substrate, each of the first conductive layers extending in a second direction intersecting the first direction;
a second conductive layer extending in the second direction above the first conductive layers;
a third conductive layer extending in the second direction above the first conductive layers, the third conductive layer being arranged adjacently to the second conductive layer in a third direction intersecting the first direction and the second direction;
a plurality of first pillars extending through the first conductive layers and the second conductive layer in the first direction, intersections of the first pillars with at least one of the first conductive layers functioning as first memory cells and intersections of the first pillars with the second conductive layer functioning as first select transistors;
a plurality of second pillars extending through the first conductive layers and the third conductive layer in the first direction, intersections of the second pillars with at least one of the first conductive layers functioning as second memory cells and intersections of the second pillars with the third conductive layer functioning as second select transistors;
a plurality of third pillars extending through the first conductive layers in the first direction and extending between the second conductive layer and the third conductive layer;
a first insulator provided in a first slit extending in the first and second directions along one side of the first conductive layers in the third direction, the first insulator continuously covering a bottom surface of the first slit and both side surfaces of the first slit extending in the second direction;
a second insulator provided in a second slit extending in the first and second directions along the other side of the first conductive layers in the third direction, the second insulator continuously covering a bottom surface of the second slit and both side surfaces of the second slit extending in the second direction; and
a third insulator provided in a third slit extending in the first and third directions, one end of the third slit in the third direction being coupled to one end of the first slit in the second direction and the other end of the third slit in the third direction being coupled to one end of the second slit in the second direction, and the third insulator being in contact with ends of the first conductive layers in the second direction.

2. The semiconductor memory device according to claim 1, wherein
the one side of the first conductive layers in the third direction is in contact with the first insulator in the first slit, and
the other side of the first conductive layers in the third direction is in contact with the second insulator in the second slit.

3. The semiconductor memory device according to claim 1, wherein intersections of the third pillars with any one of the first conductive layers function as neither memory cells.

4. The semiconductor memory device according to claim 1, wherein
each of the first pillars is electrically connected to a bit line,
each of the second pillars is electrically connected to a bit line, and
none of the third pillars is electrically connected to any bit line.

5. The semiconductor memory device according to claim 1, wherein
one side of the third pillars in the third direction is in contact with the second conductive layer, and
the other side of the third pillars in the third direction is in contact with the third conductive layer.

6. The semiconductor memory device according to claim 1, further comprising:
a fourth insulator provided in a fourth slit extending in the first and second directions between the second conductive layer and the third conductive layer, the fourth insulator covering a bottom surface of the fourth slit and both side surfaces of the fourth slit extending in the second direction, the fourth slit extending into the third pillars in the first direction.

7. The semiconductor memory device according to claim 6, wherein the fourth insulator is in contact with one side of the second conductive layer in the third direction and with one side of the third conductive layer in the third direction.

8. The semiconductor memory device according to claim 6, wherein the fourth insulator does not extend through any of the first conductive layers.

9. The semiconductor memory device according to claim 6, wherein the fourth slit is not coupled to the first slit, the second slit, and the third slit.

10. The semiconductor memory device according to claim 6, further comprising:
a fifth insulator provided in a fifth slit extending in the first and second directions between the fourth slit and the second slit, the fifth insulator covering a bottom surface of the fifth slit and both side surfaces of the fifth slit extending in the second direction.

11. The semiconductor memory device according to claim 10, wherein the fifth insulator extends through the plurality of first conductive layers.

12. The semiconductor memory device according to claim 10, wherein the fifth slit is not coupled to the first slit, the second slit, the third slit, and the fourth slit.

13. The semiconductor memory device according to claim 10, wherein one end of the fifth slit in the second direction is spaced apart from the third slit, with the first conductive layers there between.

* * * * *